(12) United States Patent
Yao et al.

(10) Patent No.: US 11,519,564 B2
(45) Date of Patent: Dec. 6, 2022

(54) LIGHT EMITTING BULB

(71) Applicant: EPISTAR CORPORATION, Hsinchu (TW)

(72) Inventors: Chiu-Lin Yao, Hsinchu (TW); Min-Hsun Hsieh, Hsinchu (TW); Been-Yu Liaw, Hsinchu (TW); Wei-Chiang Hu, Hsinchu (TW); Po-Hung Lai, Hsinchu (TW); Chun-Hung Liu, Hsinchu (TW); Shih-An Liao, Hsinchu (TW); Yu-His Sung, Hsinchu (TW); Ming-Chi Hsu, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 0 days.

(21) Appl. No.: 17/367,820

(22) Filed: Jul. 6, 2021

(65) Prior Publication Data

US 2021/0381659 A1    Dec. 9, 2021

Related U.S. Application Data

(63) Continuation of application No. 16/258,281, filed on Jan. 25, 2019, now Pat. No. 11,054,088, which is a (Continued)

(51) Int. Cl.
  *F21K 9/00* (2016.01)
  *F21K 9/235* (2016.01)
  (Continued)

(52) U.S. Cl.
  CPC .............. *F21K 9/235* (2016.08); *F21K 9/232* (2016.08); *H01L 25/0753* (2013.01);
  (Continued)

(58) Field of Classification Search
  CPC ... H01L 2224/16225; H01L 2224/3225; H01L 2224/48091; H01L 2224/48137;
  (Continued)

(56) References Cited

U.S. PATENT DOCUMENTS

| 4,445,132 A | 4/1984 | Ichikawa et al. |
| 4,764,802 A | 8/1988 | Kuwahara |

(Continued)

FOREIGN PATENT DOCUMENTS

| CN | 101262118 A | 9/2008 |
| CN | 102169937 A | 8/2011 |

(Continued)

*Primary Examiner* — Gerald J Sufleta, II
(74) *Attorney, Agent, or Firm* — Patterson + Sheridan, LLP

(57) ABSTRACT

This disclosure discloses a light-emitting bulb. The light-emitting bulb includes a cover, an electrical associated with the cover, a board arranged between the cover and the electrical connector, and a first light-emitting device disposed on the board. The first light-emitting device includes a carrier having a first side and a second side, a first electrode part disposed near the first side and extending to the second side, a bended part disposed near to the second side and spaced apart from the first electrode part, and a second electrode part extending from the bended part to the first side. No light-emitting diode unit is arranged on the second electrode part.

10 Claims, 25 Drawing Sheets

Related U.S. Application Data continuation of application No. 15/605,535, filed on May 25, 2017, now Pat. No. 10,222,002, which is a continuation of application No. 14/301,060, filed on Jun. 10, 2014, now Pat. No. 9,664,340.

(51) Int. Cl.

| | | |
|---|---|---|
| *H01L 25/075* | (2006.01) | |
| *F21K 9/232* | (2016.01) | |
| *H01L 33/54* | (2010.01) | |
| *H01L 33/62* | (2010.01) | |
| *F21Y 115/10* | (2016.01) | |
| *F21Y 107/10* | (2016.01) | |
| *F21Y 107/30* | (2016.01) | |

(52) U.S. Cl.
CPC ....... *F21Y 2107/10* (2016.08); *F21Y 2107/30* (2016.08); *F21Y 2115/10* (2016.08); *H01L 33/54* (2013.01); *H01L 33/62* (2013.01); *H01L 2224/16225* (2013.01); *H01L 2224/32225* (2013.01); *H01L 2224/48091* (2013.01); *H01L 2224/48137* (2013.01); *H01L 2224/48227* (2013.01); *H01L 2224/49107* (2013.01); *H01L 2224/73265* (2013.01)

(58) Field of Classification Search
CPC ..... H01L 25/0753; H01L 33/54; H01L 33/62; F21K 9/235; F21K 9/232; F21Y 2107/10; F21Y 2107/30
See application file for complete search history.

(56) References Cited

U.S. PATENT DOCUMENTS

| | | | |
|---|---|---|---|
| 5,882,949 | A | 3/1999 | Okazaki |
| 6,281,435 | B1 | 8/2001 | Maekawa |
| 6,582,991 | B1 | 6/2003 | Maeda et al. |
| 6,657,236 | B1 | 12/2003 | Thibeault et al. |
| 7,126,162 | B2 | 10/2006 | Reeh et al. |
| 7,273,765 | B2 | 9/2007 | Minamio et al. |
| 7,285,801 | B2 | 10/2007 | Eliashevich et al. |
| 7,397,133 | B2 | 7/2008 | Wu |
| 8,226,266 | B2 | 7/2012 | Chiang |
| 8,534,866 | B2 | 9/2013 | Cai et al. |
| 8,596,820 | B2 | 12/2013 | Fukasawa et al. |
| 8,884,328 | B2 | 11/2014 | Lim et al. |
| 9,261,242 | B2 | 2/2016 | Ge et al. |
| 9,360,167 | B2 | 6/2016 | Imai et al. |
| 9,482,391 | B2 | 11/2016 | Su |
| 2001/0022021 | A1 | 9/2001 | Maekawa |
| 2002/0070449 | A1 | 6/2002 | Yagi et al. |
| 2003/0021113 | A1 | 1/2003 | Begemann |
| 2003/0031015 | A1 | 2/2003 | Ishibashi |
| 2004/0212717 | A1 | 10/2004 | Minamio et al. |
| 2004/0266044 | A1 | 12/2004 | Park et al. |
| 2006/0001384 | A1 | 1/2006 | Tain et al. |
| 2006/0076883 | A1 | 4/2006 | Himaki et al. |
| 2006/0214179 | A1 | 9/2006 | Cao |
| 2007/0001282 | A1 | 1/2007 | Kang et al. |
| 2007/0045802 | A1 | 3/2007 | Chen |
| 2007/0159828 | A1 | 7/2007 | Wang |
| 2007/0200119 | A1 | 8/2007 | Li et al. |
| 2008/0128714 | A1 | 6/2008 | Pang et al. |
| 2008/0308832 | A1 | 12/2008 | Hsieh et al. |
| 2008/0316755 | A1 | 12/2008 | Zheng et al. |
| 2009/0127570 | A1 | 5/2009 | Tamai et al. |
| 2009/0184618 | A1 | 7/2009 | Hakata et al. |
| 2009/0316398 | A1 | 12/2009 | Chang |
| 2010/0006881 | A1 | 1/2010 | Seo et al. |
| 2010/0207502 | A1 | 8/2010 | Cao et al. |
| 2010/0276706 | A1 | 11/2010 | Herrmann |
| 2010/0314985 | A1 | 12/2010 | Premysler |
| 2011/0042698 | A1 | 2/2011 | Chan et al. |
| 2011/0049224 | A1 | 3/2011 | Ashe et al. |
| 2011/0068356 | A1 | 3/2011 | Chiang et al. |
| 2011/0140078 | A1 | 6/2011 | Hsu |
| 2011/0163346 | A1 | 7/2011 | Seo et al. |
| 2011/0163681 | A1 | 7/2011 | Dau et al. |
| 2011/0254032 | A1 | 10/2011 | Lee et al. |
| 2011/0272712 | A1 | 11/2011 | Jeong et al. |
| 2012/0018750 | A1 | 1/2012 | Wang et al. |
| 2012/0032214 | A1 | 2/2012 | Ito et al. |
| 2012/0049732 | A1 | 3/2012 | Chuang |
| 2012/0241790 | A1 | 9/2012 | Ke et al. |
| 2013/0026520 | A1 | 1/2013 | Hu et al. |
| 2013/0037845 | A1 | 2/2013 | Huang et al. |
| 2013/0062636 | A1 | 3/2013 | Lo |
| 2013/0099269 | A1 | 4/2013 | Lee et al. |
| 2013/0106301 | A1 | 5/2013 | Imai |
| 2013/0217160 | A1 | 8/2013 | Chen et al. |
| 2014/0362573 | A1 | 12/2014 | Imai et al. |
| 2015/0146426 | A1 | 5/2015 | Yeh |
| 2016/0005941 | A1 | 1/2016 | Tsai et al. |
| 2017/0051878 | A1 | 2/2017 | Jiang et al. |
| 2017/0059767 | A1 | 3/2017 | Li |
| 2018/0350872 | A1 | 12/2018 | Choi et al. |
| 2019/0257503 | A1 | 8/2019 | Ho et al. |
| 2019/0371856 | A1 | 12/2019 | Cha et al. |

FOREIGN PATENT DOCUMENTS

| | | |
|---|---|---|
| CN | 102244173 A | 11/2011 |
| JP | 3172947 B2 | 6/2001 |
| JP | 2009259768 A | 11/2009 |
| JP | 2012099726 A | 5/2012 |
| JP | 2013045943 A | 3/2013 |
| TW | 200618355 A | 6/2006 |
| TW | 200702825 A | 1/2007 |
| TW | 200849655 A | 12/2008 |
| TW | 201013980 A | 4/2010 |
| TW | 201145589 A | 12/2011 |
| TW | 201205859 A | 2/2012 |

LIGHT EMITTING BULB

REFERENCE TO RELATED APPLICATION

This present application is a continuation application of U.S. patent application Ser. No. 16/258,281, filed on Jan. 25, 2019, which is a continuation application of U.S. patent application Ser. No. 15/605,535, filed on May 25, 2017, now U.S. Pat. No. 10,222,002, issued Mar. 5, 2019, which is a continuation application of U.S. patent application Ser. No. 14/301,060, filed on Jun. 10, 2014, now U.S. Pat. No. 9,664,340, issued May 30, 2017, which claims the right of priority based on TW application Serial No. 102120893, filed on Jun. 11, 2013. The entire contents of the applications are hereby incorporated by reference.

BACKGROUND

Technical Field

The present disclosure relates to a light-emitting bulb, and in particular to a light-emitting bulb with an omnidirectional light pattern.

Description of the Related Art

The light-emitting diodes (LEDs) of the solid-state lighting elements have the characteristics of low power consumption, low heat generation, long operational life, shockproof, small volume, quick response and good opto-electrical property like light emission with a stable wavelength so the LEDs have been widely used in household appliances, indicator light of instruments, and opto-electrical products, etc. As the opto-electrical technology develops, the solid-state lighting elements have great progress in the light efficiency, operation life and the brightness, and LEDs are expected to become the main stream of the lighting devices in the coming future. However, in some application, there is a need to have a light-emitting apparatus with an omnidirectional light pattern which is not available using the conventional light emitting apparatus.

It is noted that the LEDs can be further connected to other components in order to form a light emitting apparatus. For example, the LEDs is disposed on a submount, and then on a carrier. Alternatively, a solder or an adhesive is formed between the LEDs and the carrier to form the light emitting apparatus. In addition, the carrier can further include electrode for electrically connecting to the LEDs.

SUMMARY OF THE DISCLOSURE

The present disclosure provides a light-emitting bulb with an omnidirectional light pattern.

This disclosure discloses a light-emitting bulb. The light-emitting bulb includes a cover, an electrical associated with the cover, a board arranged between the cover and the electrical connector, and a first light-emitting device disposed on the board. The first light-emitting device includes a carrier having a first side and a second side, a first electrode part disposed near the first side and extending to the second side, a bended part disposed near to the second side and spaced apart from the first electrode part, and a second electrode part extending from the bended part to the first side. No light-emitting diode unit is arranged on the second electrode part.

BRIEF DESCRIPTION OF THE DRAWING

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure. In addition, these drawings are not necessarily drawn to scale. Likewise, the relative sizes of elements illustrated by the drawings may differ from the relative sizes depicted.

The following shows the description of embodiments of the present disclosure in accordance with the drawings.

Figure 1A:
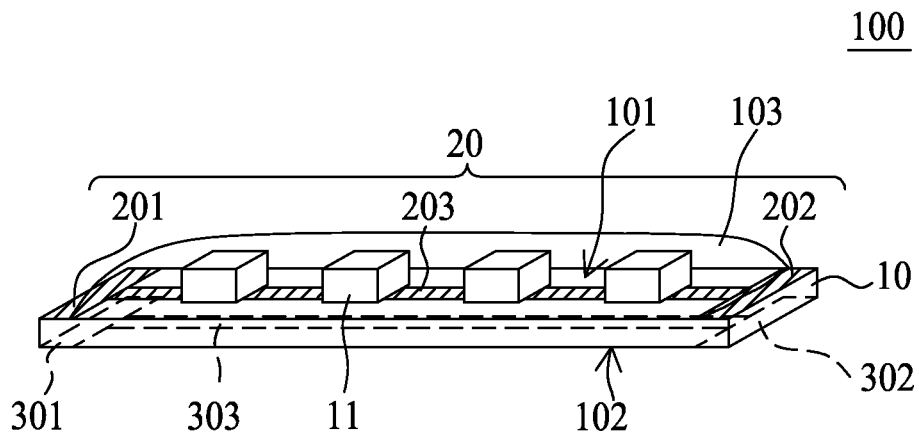
FIGS. 1A and 1B illustrate a perspective view of a light-emitting device in accordance with one embodiment of the present disclosure.
Figure 1B:
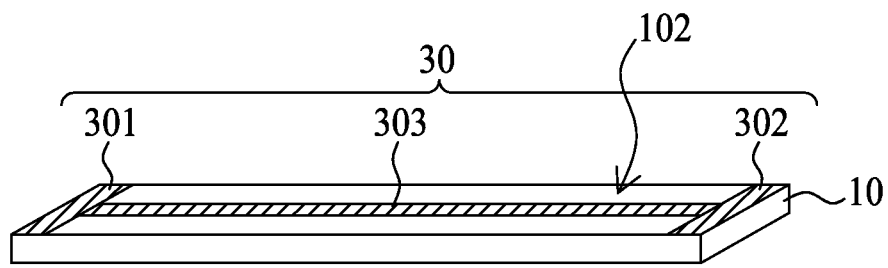
Figure 1C:
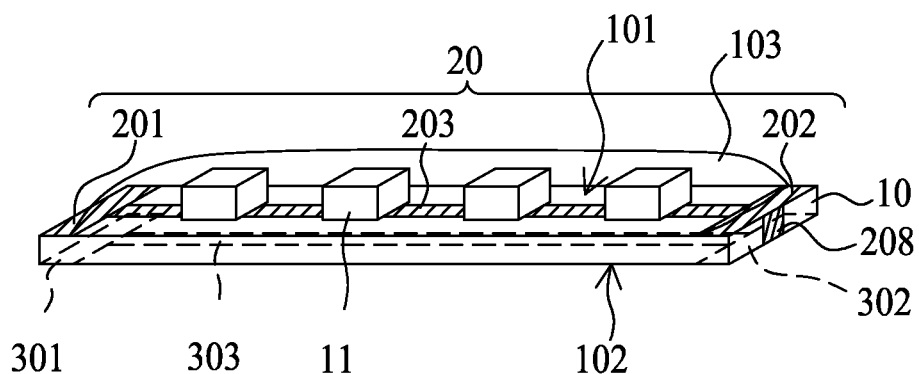
FIG. 1C illustrates a perspective view of a light-emitting device in accordance with another embodiment of the present disclosure, showing a conductive connecting connector formed on a side of a carrier.

FIGS. 1A and 1B illustrate a perspective view of a light emitting device 100 in accordance with one embodiment of the present disclosure. The light-emitting device 100 includes an oblong carrier with a top surface 101 and a bottom surface 102 opposite to the top surface 101, a plurality of light-emitting units 11 disposed on the top surface 101, a top electrode 20 formed on the top surface 101, a bottom electrode 30 formed on the bottom surface 102, and a transparent body 103 covering the top electrode 20 and the light-emitting units 11. In this embodiment, the carrier 10 has a length of 18 mm-30 mm and a width smaller than 3 mm, and the light-emitting unit 11 has a width of 0.5 mm-1.5 mm and a length of 1 mm-3 mm. Referring to FIG. 1A, the top electrode 20 includes two top electrode pads 201, 202 and a top electrode connector 203. Referring to FIG. 1B, the bottom electrode 30 is formed on the bottom surface 102 and includes two bottom electrode pads 301, 302 and a bottom electrode connector 303. The bottom electrode connector 303 can be a straight line, and is physically and electrically connected to the two electrode pads 301, 302. As shown in FIG. 1C, a conductive connecting connector 208 is optionally formed on a side of the carrier 10 for electrically connecting the top electrode pad 202 with the bottom electrode pad 302. Alternatively, a via hole (not shown) is formed within and penetrating the carrier 10, and a conductive material is fully or partly filled with the via hole for electrically connecting the top electrode pad 202 with the bottom electrode pad 302. In operation, when the light-emitting device 100 is connected to an external source (power supply) and when the conductive connecting connector 208 is not provided, the two top electrode pads 201, 202 can be respectively connected to a positive node and a negative node of the external source such that the light-emitting units 11 can emit light, that is, the external source is connected to the carrier 10 at the same surface (top surface) but at two opposite sides. In one embodiment, when the conductive connecting connector 208 is further provided for electrically connecting the top electrode pad 202 with the bottom electrode pad 302, a positive node and a negative node of the external source can be respectively connected to the top electrode pad 201 and the bottom electrode pad 301 such that the light-emitting units 11 can emit light, that is, the external source is connected to the carrier 10 at the different surfaces (top surface and bottom surface) but at the same side. By virtue of the top electrode 20, the bottom electrode 30 and/or the conductive connecting connector 208, the light-emitting device 100 can be connected to the external source at the different surfaces but the same side or at the same surface but two opposite sides for different application of the light-emitting device.

The transparent body 103 can includes a single layer or a multilayer structure. When the transparent body 103 is a multilayer structure (not shown), it sequentially includes a first transparent layer, a wavelength conversion layer, and a second transparent layer. The first transparent layer and the second transparent layer can include, e.g. epoxy, polyimide, BCB, PFCB, SUB, acrylic resin, PMMA, PET, PC, polyetherimide, fluorocarbon polymer, glass, $Al_2O_3$, SINR, SOG, poly(tetrafluoroethene) or combinations thereof. The wavelength conversion layer includes aluminum oxide (such as YAG or TAG), silicate, vanadate, alkaline-earth metal silicate, alkaline-earth metal sulfide, alkaline-earth metal selenide, alkaline-earth metal gallium silicate, metal nitride, metal nitride oxide, a mixture of tungstate and molybdate, a mixture of oxide, or combinations thereof. In this embodiment, the light-emitting unit 11 can emit a blue light with a peak wavelength of 430 nm-480 nm, and some of the blue light is converted by the wavelength conversion layer to emit a yellow light with a peak wavelength of 570 nm-590 nm or a yellowish green light with a peak wavelength of 540 nm-570 nm. Furthermore, the yellow light or the yellowish green light is mixed with the unconverted blue light to produce a white light.

Figure 2A:
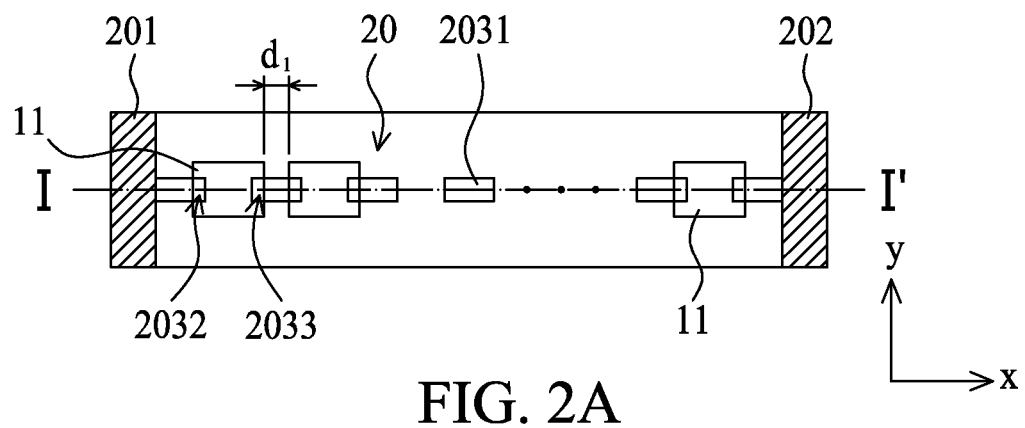
FIG. 2A illustrates a top view of a light-emitting device in accordance with one embodiment of the present disclosure.
Figure 2B:
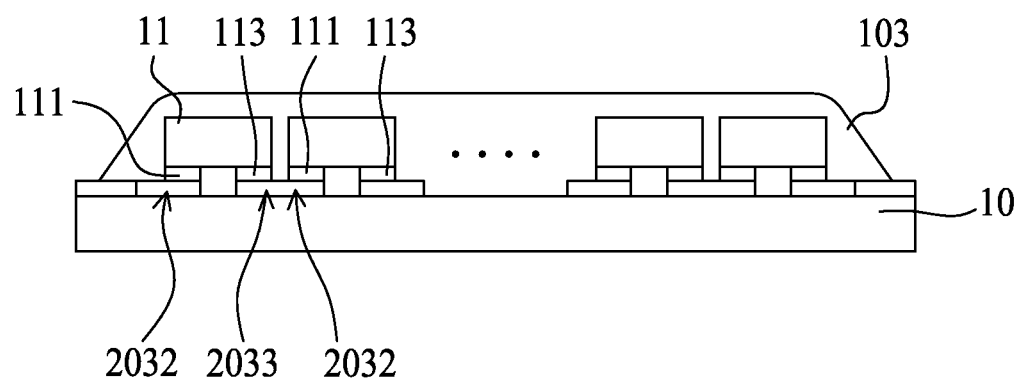
FIG. 2B illustrates a cross-sectional view taken along from line I-I' of FIG. 2A.

FIG. 2A is a top view of the light-emitting device as shown in FIG. 1A without showing the transparent body 103. Refereeing to FIGS. 1A and 2A, the top electrode connector 203 is patterned and includes a plurality of electrode blocks 2031. In this embodiment, the electrode blocks 2031 are arranged in a straight line along a length direction of the carrier 10 (X) and physically spaced apart from each other. Each of the electrode blocks 2031 includes a first end 2032 and a second end 2033. In one embodiment, a distance ($d_1$) between the two adjacent light-emitting units 11 is 0.5 mm-1.2 mm, and each of the distances between the two adjacent light-emitting units 11 can be the same or different depending on actual requirements. FIG. 2B is a cross-sectional view taken along line I-I' of FIG. 2A with the transparent body 103 included. Referring to FIG. 2B, each of the light-emitting units 11 has a first connecting pad 111 (for example, p pad) and a second connecting pad 113 (for example, n pad). The first connecting pad 111 and the second connecting pad 113 are at positions corresponding to the first end 2032 of one electrode block 2031 and the second end 2033 of adjacent one electrode block 2031 for physically and electrically connecting therebetween. Accordingly, the light-emitting units 11 are electrically connected in series with each other on the carrier 10. The transparent body 103 is provided to cover portions of the top electrode 20 and the light-emitting units 11.

Figure 3A:
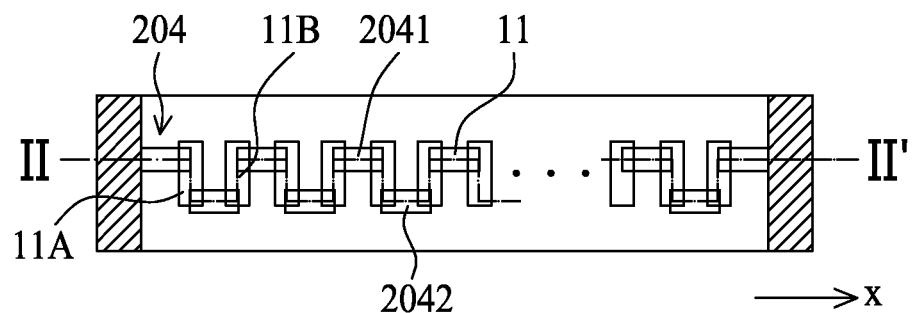
FIG. 3A illustrates a top view of a light-emitting device in accordance with one embodiment of the present disclosure.
Figure 3B:
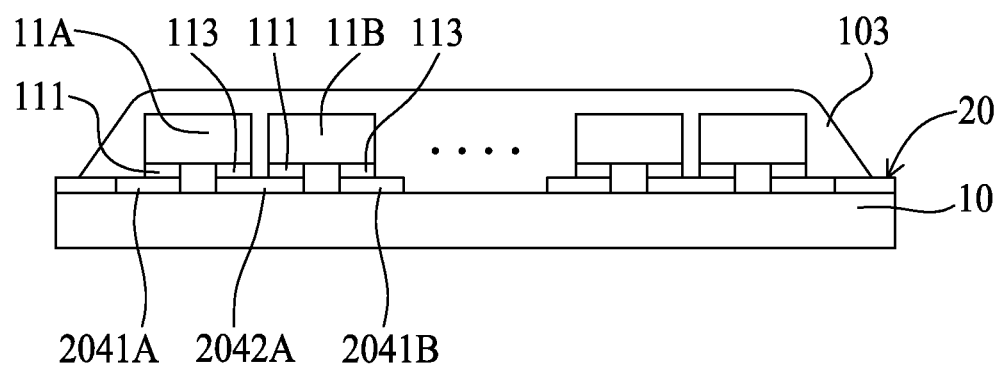
FIG. 3B illustrates a cross-sectional view taken along from line II-II' of FIG. 3A.

FIG. 3A is a top view of a light-emitting device in accordance with another embodiment of the present disclosure, but without showing the transparent body. FIG. 3B is a cross-sectional view taken along line II-IF of FIG. 3A with the transparent body included. Referring to FIGS. 3A and 3B, a top electrode connector 204 includes a first electrode region 2041 and a second electrode region 2042. The first electrode region 2041 and the second electrode region 2042 are parallelly and alternately arranged along the length direction of the carrier 10 (X) and physically spaced apart from each other. The light-emitting units 11 are arranged along the length direction of the carrier 10 (X), and the first connecting pad 111 and the second connecting pad 113 are at positions corresponding to the first electrode region 2041 and the second electrode region 2042 for physically and electrically connecting therebetween. For example, the first connecting pad 111 of the light-emitting unit 11A is corresponding to the first electrode region 2041A and the second connecting pad 113 of the light-emitting unit 11A is corresponding to the second electrode region 2042A; the first connecting pad 111 of the light-emitting unit 11B is corresponding to the second electrode region 2042A and the second connecting pad 113 of the light-emitting unit 11B is corresponding to the first electrode region 2041B. The second connecting pad 113 of the light-emitting unit 11A and the first connecting pad 111 of the light-emitting unit 11B are both disposed on the second electrode region 2042A for electrically connecting therebetween. Accordingly, the light-emitting units 11 are electrically connected in series with each other on the carrier 10. In this embodiment, the second connecting pad 113 of the light-emitting units 11A and the first connecting pad 111 of the light-emitting units 11B are at the same side of the carrier 10; the first connecting pad 111 of the light-emitting units 11A and the second connecting pad 113 of the light-emitting units 11B are at another side of the carrier 10. The light-emitting device further includes a transparent body 103 covering the top electrode 20 and the light-emitting units 11.

Figure 4A:
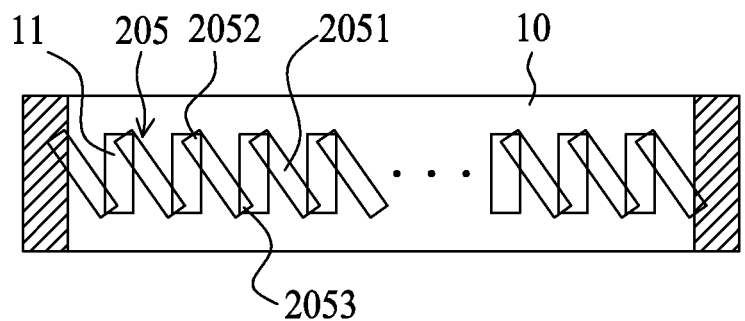
FIG. 4A illustrates a top view of a light-emitting device in accordance with another embodiment of the present disclosure.

FIG. 4A is a top view of a light-emitting device in accordance with another embodiment of the present disclosure. Referring to FIG. 4A, a top electrode connector 205 includes a plurality of electrode zones 2051 arranged along the length direction of the carrier 10 at a first oblique angle to the length direction. Each of the electrode zones 2051 has a first end 2052 and a second end 2053. The light-emitting units 11 are arranged along the length direction of the carrier 10 and at a second oblique angle with respect to the electrode zones 2051. The first oblique angle can be the same or different from the second oblique angle. Each of the light-emitting units 11 has a first connecting pad (not shown) and a second connecting pad (not shown). The first connecting pad and the second connecting pad are respectively at positions corresponding to the first end 2052 of one electrode zone 2051 and the second end 2053 of adjacent one electrode zone 2051 for physically and electrically connecting therebetween. Accordingly, the light-emitting units 11 are electrically connected in series with each other on the carrier 10. In this embodiment, all the second connecting pads of the light-emitting units 11 are at the same side of the carrier 10 and all the first connecting pads of the light-emitting units 11 are at another side of the carrier 10.

Figure 4B:
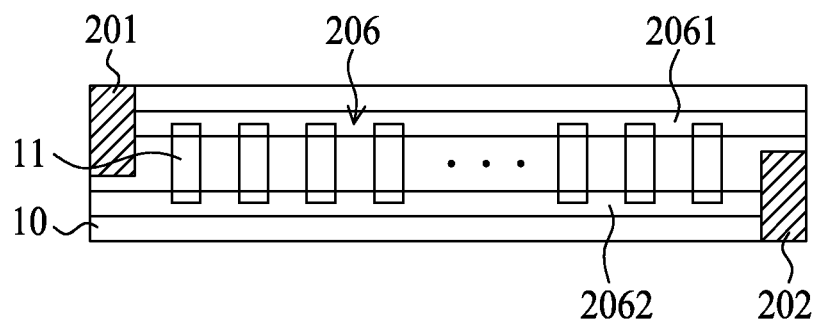
FIG. 4B illustrates a top view of a light-emitting device in accordance with another embodiment of the present disclosure.

FIG. 4B is a top view of a light-emitting device in accordance with another embodiment of the present disclosure. Referring to FIG. 4B, a top electrode connector 206 includes a first electrode bar 2061 and a second electrode bar 2062. The top electrode pad 201 is merely connected to the first electrode bar 2061 and the top electrode pad 202 is merely connected to the second electrode bar 2062. Each of the light-emitting units 11 has a first connecting pad (not shown) and a second connecting pad (not shown). The first connecting pad and the second connecting pad are respectively at positions corresponding to the first electrode bar 2061 and second electrode bar 2062 for physically and electrically connecting therebetween. Accordingly, the light-emitting units 11 are electrically connected in parallel with each other on the carrier 10.

Figure 4C:
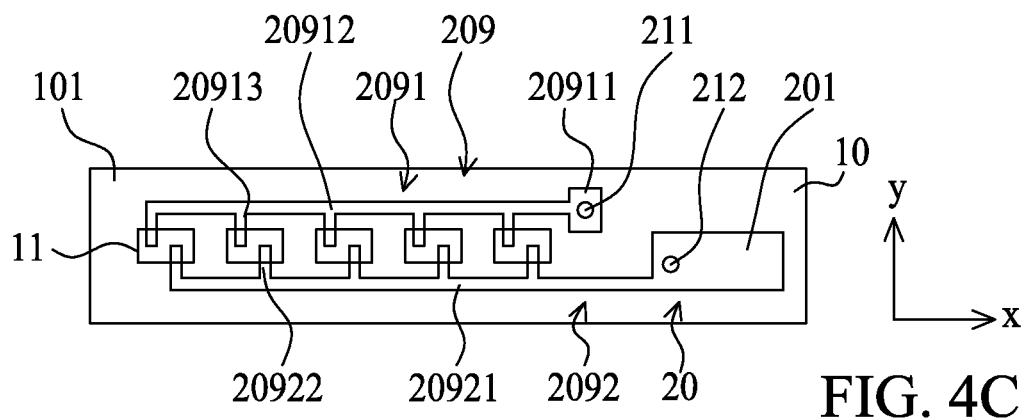
FIG. 4C illustrates a top view of a light-emitting device in accordance with another embodiment of the present disclosure.

FIG. 4C is a top view of a light-emitting device in accordance with another embodiment of the present disclosure. Referring to FIG. 4C, the top electrode 20 includes a top electrode pad 201 and a top electrode connector 209 formed on the top surface 101 of the carrier 10. The top electrode connector 209 includes a first electrode strip 2091 and the second electrode strip 2092. The first electrode strip 2091 and the second electrode strip 2092 are physically spaced apart from each other. The first electrode strip 2091 includes a first region 20911, a first stripe 20912 electrically connecting to and extending from the first region 20911 along the length direction of the carrier 10 (−X), and a plurality of first branches 20913 electrically connecting to and extending from the first stripe 20912 along the width direction of the carrier 10 (−Y). The second electrode strip 2092 includes a second stripe 20921 electrically connecting to and extending from the top electrode pad 201 along the length direction of the carrier 10 (−X); and a plurality of second branches 20922 electrically connecting to and extending from the second stripe 20921 along the width direction of the carrier 10 (Y). The first stripe 20912 and the second stripe 20921 are parallel with each other; and the first branches 20913 and the second branches 20922 are alternately and parallelly arranged with each other. Each of the light-emitting units 11 has a first connecting pad (not shown) and a second connecting pad (not shown) which are at positions respectively corresponding to the first branches 20913 and the second branches 20922 for electrically connecting therebetween.

Figure 4D:
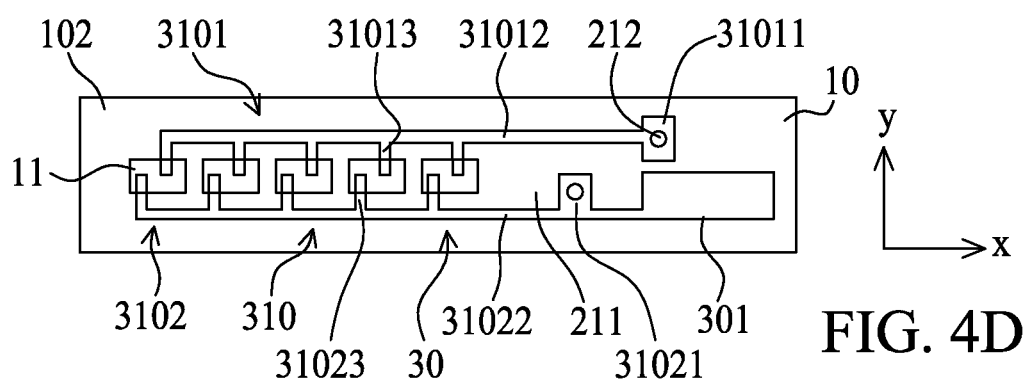
FIG. 4D illustrates a bottom view of the light-emitting device of FIG. 4C.

FIG. 4D illustrates a bottom view of the light-emitting device in FIG. 4C. The bottom electrode 30 includes a bottom electrode pad 301 and a bottom electrode connector 310 formed on the bottom surface 102 of the carrier 10. The bottom electrode line 310 includes a third electrode strip 3101 and the fourth electrode strip 3102. The third electrode strip 3101 and the fourth electrode strip 3102 are physically spaced apart from each other. The third electrode strip 3101 includes a second region 31011, a third stripe 31012 electrically connecting to and extending from the second region 31011 along the length direction of the carrier 10 (−X), and a plurality of third branches 31013 electrically connecting to and extending from the third stripe 31012 along the width direction of the carrier 10 (−Y). The fourth electrode strip 3102 includes a third region 31021, a fourth stripe 31022 electrically connecting to and extending from the bottom electrode pad 301 along the length direction of the carrier 10 (−X); and a plurality of fourth branches 31023 extending from and electrically connecting to the fourth stripe 31022 along the width direction of the carrier 10 (Y). The third stripe 31012 and the fourth stripe 31022 are parallel with each other; and the third branches 31013 and the fourth branches 31023 are alternately and parallelly arranged with each other. Each of the light-emitting units 11 has a first connecting pad (not shown) and a second connecting pad (not shown) which are at positions respectively corresponding to the fourth branches 31023 and the third branches 31013 for electrically connecting therebetween. Referring to FIGS. 4C and 4D, the first region 20911 is at the position corresponding to the third region 31021 and a hole 211 penetrates through the carrier 10 at the first region 20911 and the third region 31021; the second region 31011 is at the position corresponding to the top electrode pad 201 and a hole 212 penetrates through the carrier 10 at the second region 31011 and the top electrode pad 201. The holes 211, 212 can include a conductive material fully or partly filled therewithin for electrically connecting the opposite surfaces of the carrier 10 with each other. To be more specific, when a positive node and a negative node of the external source are electrically connected to the top electrode pad 201 and the bottom electrode pad 301, respectively, the top electrode pad 201 is electrically connected to the second region 31011 through the hole 212 for further electrically connecting to the third stripe 31012 and the third branches 31013. In other words, the top electrode pad 201, the second electrode strip 2092 and the third electrode strip 3101 are electrically connected to the positive node of the external source. Likewise, the first region 20911 is electrically connected to the third region 31021 through the hole 211. Since the third region 31021 is electrically connected to the bottom electrode pad 301, the bottom electrode pad 301 can be electrically connected to the first stripe 20912 and the first branches 20913. In other words, the bottom electrode pad 301, the first electrode strip 2091 and the fourth electrode strip 3102 are electrically connected to the negative node of the external source. Accordingly, the light-emitting units 11 on the top surface 101 and the bottom surface 102 are all electrically connected in parallel with each other for emitting light. In this embodiment, with the hole 211, the first stripe 20912 and the fourth stripe 31022 are electrically connected to each other. In other embodiment, instead of forming the first stripe 20912, the first regions 20911 and the hole 211, a plurality of individual holes is formed corresponding to each the first branch 20913 for electrically connecting the first branch 20913 with the fourth stripe 31022.

Figure 4E:
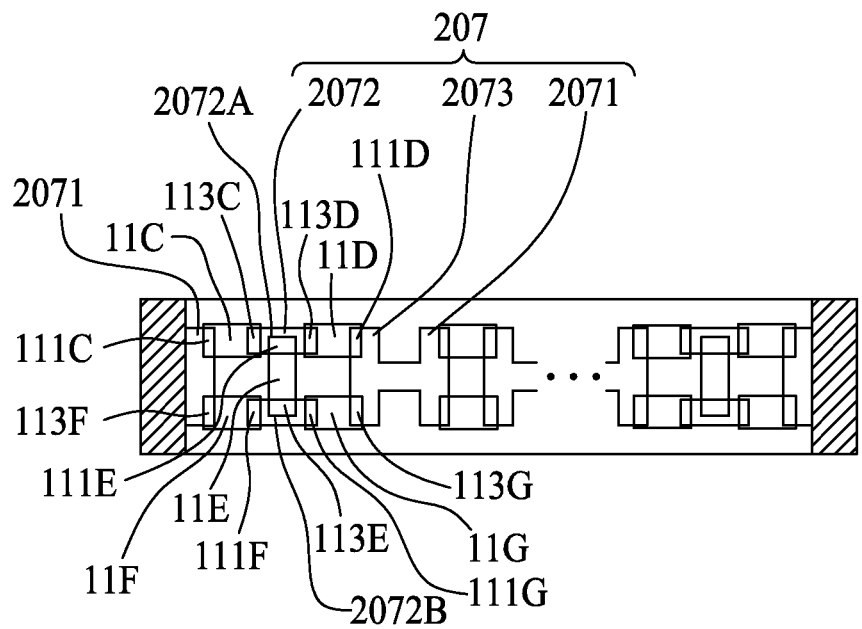
FIG. 4E illustrates a top view of a light-emitting device in accordance with another embodiment of the present disclosure.
Figure 4F:
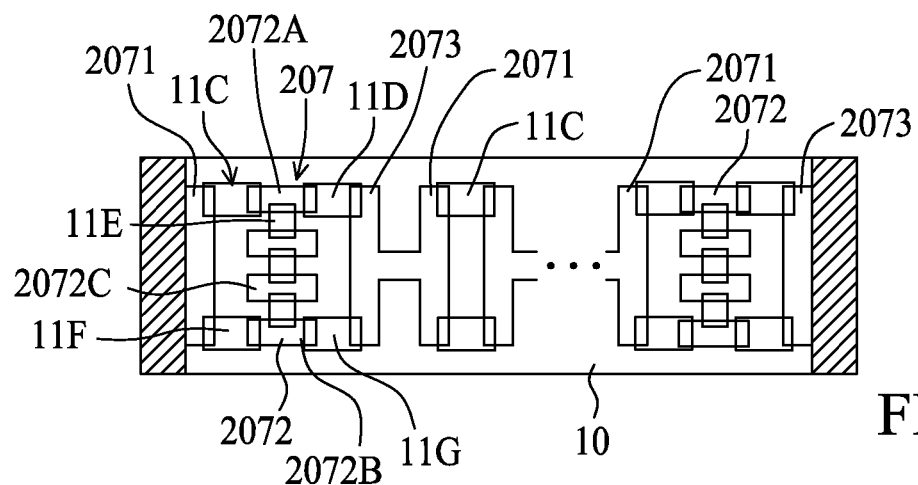
FIG. 4F illustrates a top view of a light-emitting device in accordance with another embodiment of the present disclosure.
Figure 4G:
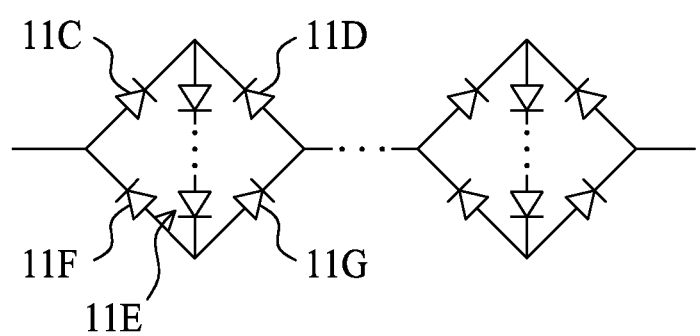
FIG. 4G illustrates an equivalent circuit of the FIG. 4F.

FIG. 4E illustrates a top view of the light-emitting device in accordance with another embodiment of the present disclosure. The top electrode connector 207 includes a first electrode region 2071, a second electrode region 2072, and a third electrode region 2073. The first electrode region 2071, the second electrode region 2072, and the third electrode region 2073 are all rectangle. The long sides of the first electrode region 2071 and the third electrode region 2073 are parallel with the short side (width) of the carrier; the short side of the second electrode region 2072 is parallel with the long side (length) of the carrier. A plurality of the light-emitting units is disposed on the carrier 10 and electrically connected to each other in a bridge configuration by the arrangement of the top electrode connector 207. The light-emitting units have the first connecting pad and the second connecting pad. It is noted that from the top view of FIG. 4E, the first connecting pad and the second connecting pad cannot be clearly viewed. However, for clarifying this embodiment the first connecting pad and the second connecting pad are labeled in FIG. 4E. To be more specific, the first connecting pad 111C of the light-emitting unit 11C is at the first electrode region 2071 for electrically connecting therebetween; the second connecting pad 113C of the light-emitting unit 11C is at the second electrode region 2072A for electrically connecting therebetween; the first connecting pad 111D of the light-emitting unit 11D is at the third electrode region 2073 for electrically connecting therebetween; the second connecting pad 113D of the light-emitting unit 11D is at the second electrode region 2072A for electrically connecting therebetween; the first connecting pad 111E of the light-emitting unit 11E is at the second electrode region 2072A for electrically connecting therebetween; the second connecting pad 113E of the light-emitting unit 11E is at the second electrode region 2072B for electrically connecting therebetween; the first connecting pad 111F of the light-emitting unit 11F is at the second electrode region 2072B for electrically connecting therebetween; the second connecting pad 113F of the light-emitting unit 11F is at the first electrode region 2071 for electrically connecting therebetween; and the first connecting pad 111G of the light-emitting unit 11G is at the second electrode region 2072B for electrically connecting therebetween; the second connecting pad 113G of the light-emitting unit 11G is at the third electrode region 2073 for electrically connecting therebetween such that the light-emitting units 11C, 11D, 11E, 11F, 11G are electrically connected to each other in the bridge configuration. Therefore, the light-emitting device can be directly connected to an alternately current (AC) power supply. FIG. 4G is an equivalent circuit of FIG. 4E. In the positive cycle of the alternately current power supply, a positive-cycle current passes through the light-emitting units 11C, 11E, 11G; and in the negative cycle of the alternately current power supply, a negative-cycle current passes through the light-emitting units 11D, 11E, 11F. In this embodiment, only one bridge configuration is described, however, there can be a plurality of bridge configurations formed on the carrier 10 for electrically connecting to each other. In addition, the quantity of the bridge configurations is adjustable depending on a desired voltage (for example, 110V, 120V, 220V or 240V). FIG. 4F illustrates a top view of a light-emitting device in accordance with another embodiment of the present disclosure. The light-emitting device in FIG. 4F is similar with that in FIG. 4E, except that the second electrode region 2072 can includes a plurality of sub electrode regions 2072C between the sub electrode regions 2072A, 2072B. A plurality of light-emitting units 11E is arranged on the sub electrode regions 2072A, 2072C, 2072B for electrically connecting in series to each other. In other embodiment, the light-emitting units 11E can be connected to each other in parallel or in series-parallel.

Figure 5A:
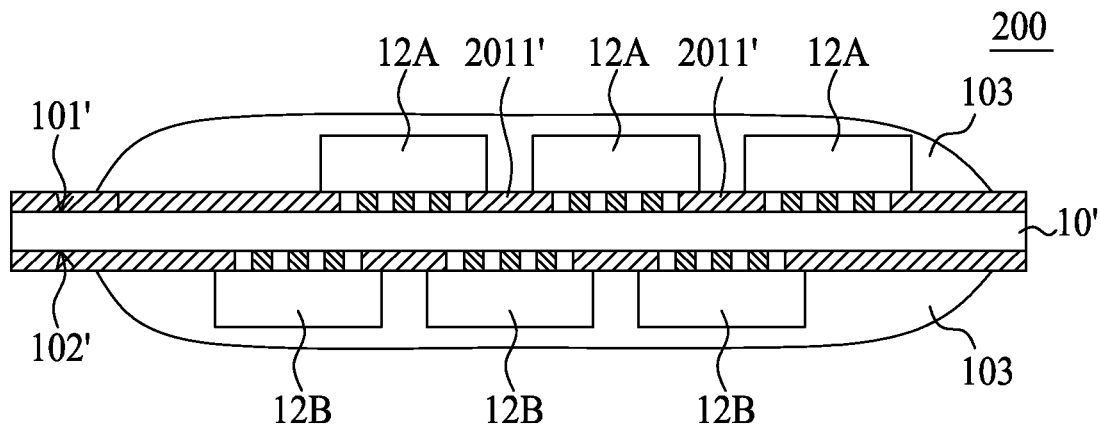
FIG. 5A illustrates a cross-sectional view of a light-emitting device in accordance with another embodiment of the present disclosure.
Figure 5B:
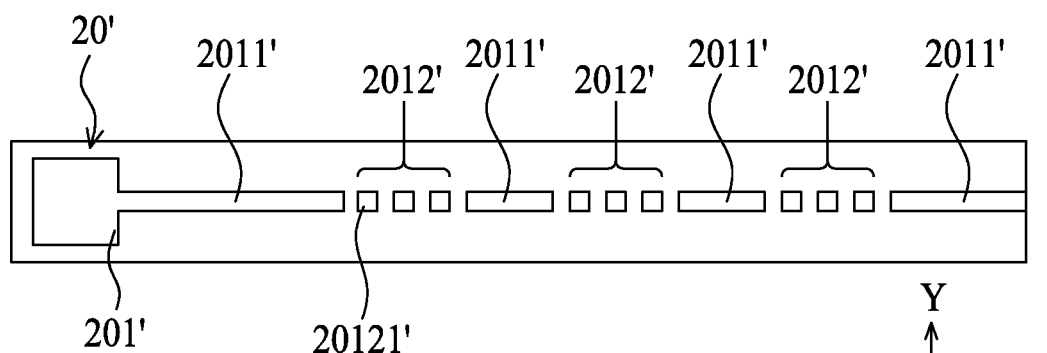
FIG. 5B illustrates a top view of the light-emitting device of FIG. 5A.
Figure 5C:
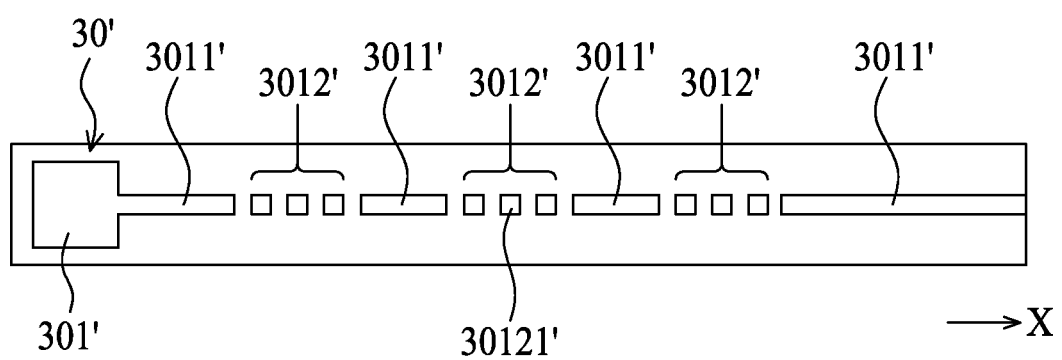
FIG. 5C illustrates a bottom view of the light-emitting device of FIG. 5A.

FIG. 5A illustrates a cross-sectional view of the light-emitting device 200 in accordance with another embodiment of the present disclosure. FIGS. 5B and 5C are a top view and a bottom view without showing the light-emitting units, respectively. Referring to FIGS. 5A-5C, the light-emitting device 200 includes a carrier 10' having a top surface 101' and a bottom surface 102' opposite to the top surface 101', a plurality of light-emitting units 12A, 12B respectively disposed on the top surface 101' and the bottom surface 102', a top electrode 20' on the top surface 101', a bottom electrode 30' formed on the bottom surface 102', and a transparent body 103 covering the top electrode 20', the bottom electrode 30', and the light-emitting units 12A, 12B. As shown in FIG. 5B, the top electrode 20' includes a top electrode pad 201', a plurality of first electrode parts 2011' and a plurality of second electrode parts 2012'. The first electrode part 2011' and the second electrode part 2012' are arranged in a straight line along a length direction of the carrier 10' (X), and physically and alternately spaced apart from each other. The second electrode part 2012' includes a plurality of sub electrode part 20121' spaced apart from each other. In this embodiment, the first electrode part 2011' between two adjacent second electrode parts 2012' has a length smaller than that of the second electrode part 2012'. A distance between two adjacent light-emitting units is smaller than a length of one of the light-emitting units. In this embodiment, the second electrode part 2012' includes three sub electrode parts 20121' which are spaced apart from each other by a distance. Referring to FIGS. 5A and 5B, the light-emitting unit 12A has a first connecting pad (not shown) at a position corresponding to the first electrode part 2011' for electrically connecting therebetween, and the light-emitting unit 12A has a second connecting pad (not shown) at a position corresponding to adjacent one first electrode part 2011' for electrically connecting therebetween, such that the light-emitting unit 12A partially covers the first electrode part 2011' and the adjacent first electrode part 2011', and fully covers the second electrode part 2012'. The second electrode part 2012' contacts the light-emitting unit 12A but is not electrically connected to the light-emitting unit 12A for dissipating heat from the light-emitting unit 12A to the ambient (air). It is noted that the "contact" means directly contact or indirectly contact. The indirectly contact indicates a conductive material (for example: solder) or a non-conductive material (for example: adhesive) formed between the light-emitting unit 12A and the second electrode part 2012'. In another embodiment, the second electrode part 2012' can also be electrically connected to the light-emitting unit 12A. Referring to FIG. 5C, the bottom electrode 30' includes a bottom electrode pad 301', a plurality of third electrode parts 3011' and a plurality of fourth electrode parts 3012'. The bottom electrode 30' has a pattern similar with that of the top electrode 20'. The third electrode parts 3011' and the fourth electrode parts 3012' are arranged in a straight line along a length direction of the carrier 10' (X), and physically and alternately spaced apart from each other. The fourth electrode part 3012' includes three sub electrode parts 30121' spaced apart from each other. Referring to FIGS. 5A and 5C, the light-emitting unit 12B has a first connecting pad (not shown) at a position corresponding to the third electrode part 3011' for electrically connecting therebetween, and the light-emitting unit 12B has a second connecting pad (not shown) at a position corresponding to adjacent third electrode part 3011' for electrically connecting therebetween. The fourth electrode part 3012' contacts the light-emitting unit 12B but is not electrically connected to the light-emitting unit 12B for dissipating heat from the light-emitting unit 12B to the ambient (air). In another embodiment, the fourth electrode part 3012' can also be electrically connected to the light-emitting unit 12B. It is noted that the first electrode part 2011' and the fourth electrode part 3012' are respectively formed on the top surface 101' and the bottom surface 102' at the position corresponding to each other, and the second electrode part 2012' and the third electrode part 3011' are respectively formed on the top surface 101' and the bottom surface 102' at the position corresponding to each other. Accordingly, the light-emitting units 12A on the top surface 101' and the light-emitting units 12B on the bottom surface 102' are alternately arranged, and the light-emitting units 12A does not fully overlap the light-emitting units 12B. The quantity, the shape, and the length of the sub electrode parts can be varied. The distance between the sub electrode parts can also be varied. Moreover, the quantity, the shape, and the length of the first electrode part 2011', the second electrode part 2012', the third electrode part 3011', the fourth electrode part 3012' can also be varied. In this embodiment, like FIG. 1C, a conductive connecting connector 208 is optionally formed on a side of the carrier 10' for electrically connecting the first electrode part 2011' at the end position with the third electrode part 3011' at the end position. Alternatively, a hole (not shown) is optionally formed to penetrate through the carrier 10' and a conductive material is fully or partly filled with the hole for electrically connecting the first electrode part 2011' with the third electrode part 3011'. Therefore, in operation, when the light-emitting device is connected to the external source, a positive node and a negative node of the external source can be electrically connected to the top electrode pad 201' and the bottom electrode pad 301' such that the light-emitting units 12A, 12B are electrically connected in series to each other for emitting light, that is, the external source is connected to the carrier 10 at the different surfaces (top surface and bottom surface) but at the same side.

Figure 5D:
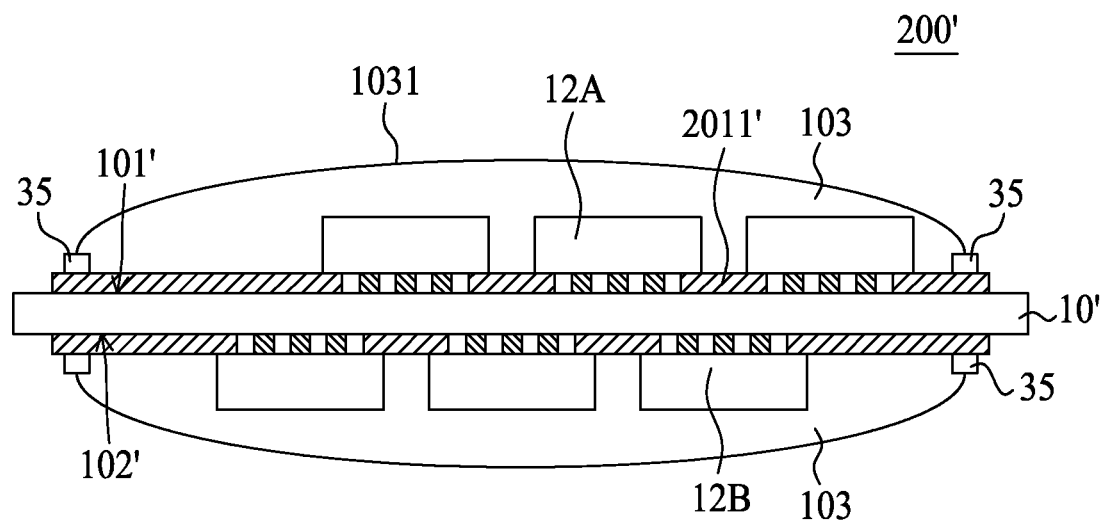
FIG. 5D illustrates a cross-sectional view of a light-emitting device in accordance with another embodiment of the present disclosure.
Figure 5E:
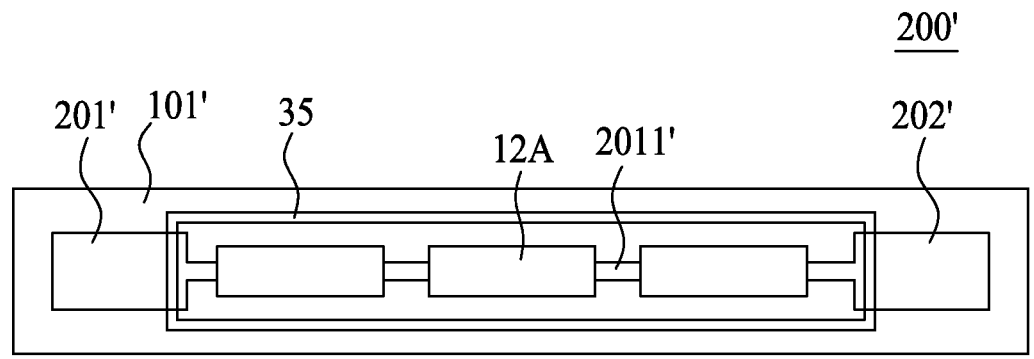
FIG. 5E illustrates a top view of the light-emitting device of FIG. 5D.

FIG. 5D illustrates a cross-sectional view of the light-emitting device 200' in accordance with another embodiment of the present disclosure. FIG. 5E illustrates a cross-sectional view of the light-emitting device 200' in accordance with another embodiment of the present disclosure. The light-emitting device 200' has a structure similar with the light-emitting device 200. The devices, elements or steps with similar or the same symbols represent those with the same or similar functions. The light-emitting device 200' further includes a dam 35 formed on the top surface 101' and/or the bottom surface 102' to surround the light-emitting units 12A, 12B (as shown in FIG. 5E). Subsequently, a transparent body 103 is formed on the light-emitting units 12A, 12B and the dam 35. In this embodiment, the dam 35 has a height (0.3 mm-0.75 mm) lower than that of the light-emitting units 12A, 12B (0.8 mm-1 mm), thereby a coverage range of the transparent body 103 can be substantially limited by the dam 35. Using the same amount of transparent body 103, compared to the light-emitting device without the dam 35, the transparent body 103 of the light-emitting device with the dam 35 has a smooth top surface for improving a uniformity of the emitting angle of the light-emitting device. The dam 35 is made of a material the same or different from the transparent body 103 and including silicone, epoxy, polyimide, BCB, PFCB, SUB, acrylic resin, PMMA, PET, PC, polyetherimide, fluorocarbon polymer, glass, $Al_2O_3$, SINR, SOG, Poly(tetrafluoroethene) or combinations thereof.

Figure 6A:
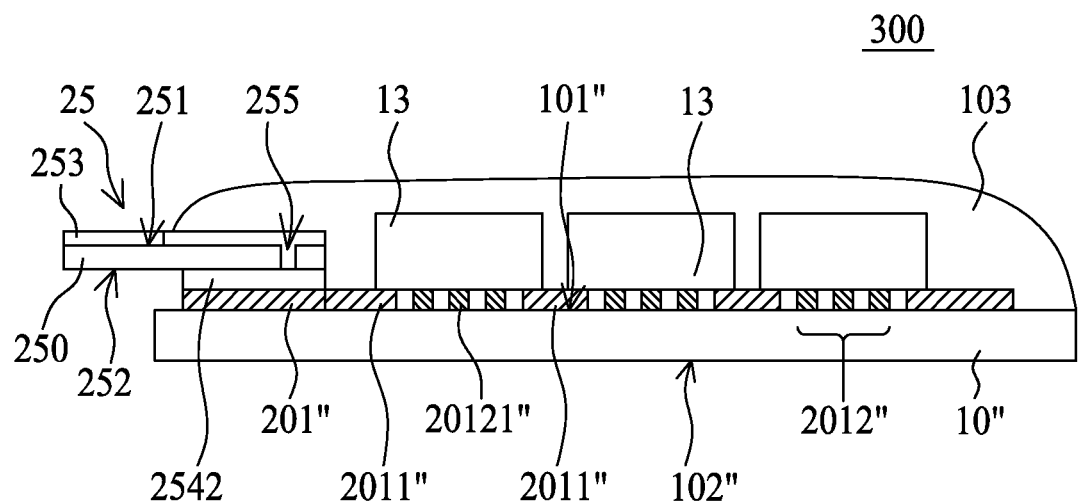
FIGS. 6A and 6B illustrate cross-sectional views of a light-emitting device in accordance with another embodiment of the present disclosure.
Figure 6B:
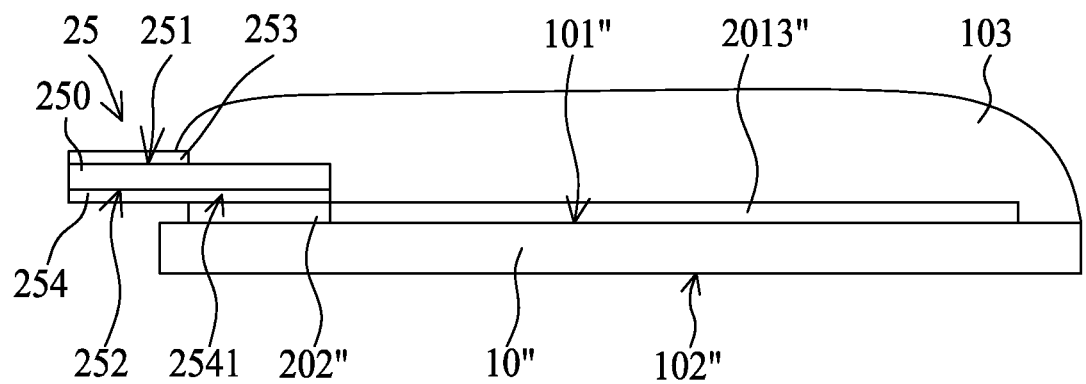
Figure 6C:
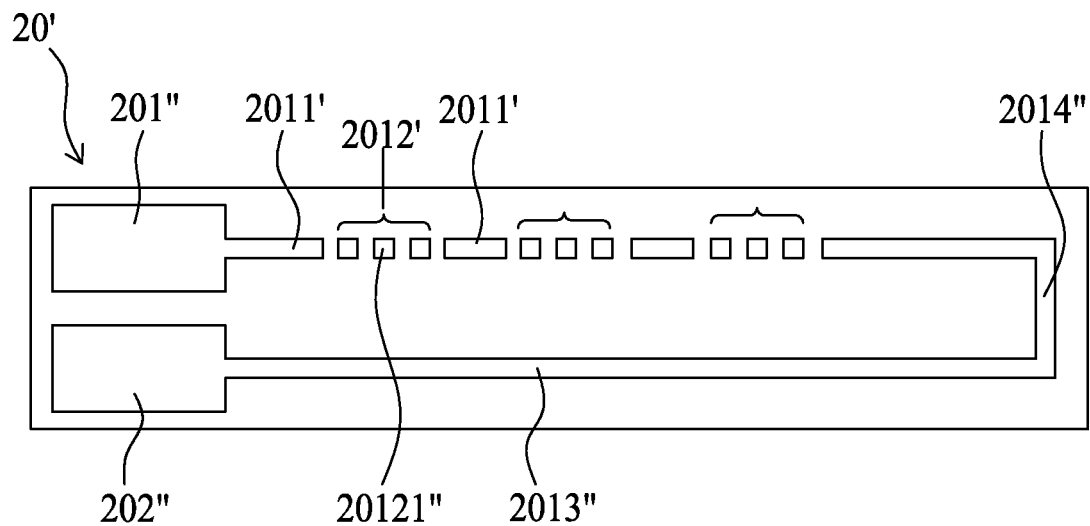
FIG. 6C illustrates a top view of the light-emitting device of FIGS. 6A and 6B.
Figures 6D, 6E:
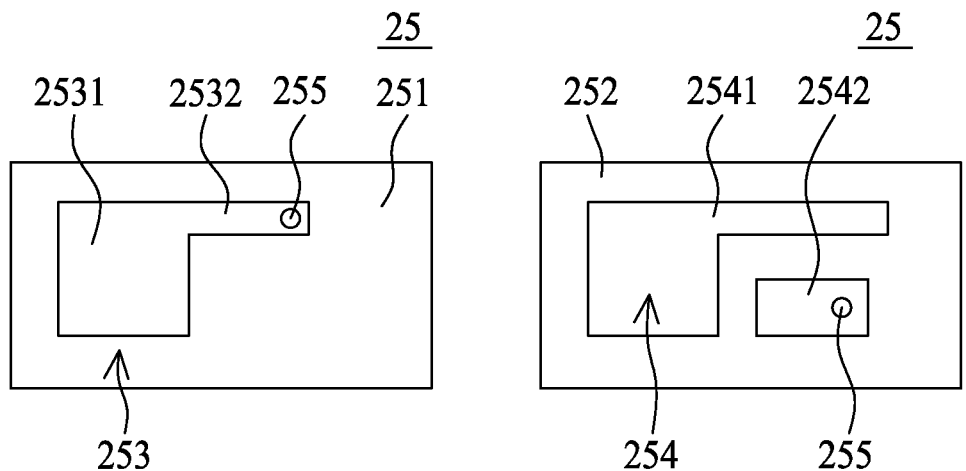
FIGS. 6D and 6E illustrate top and bottom views of an electrical plate embodied in the light-emitting device of FIGS. 6A and 6B.

FIGS. 6A and 6B illustrate cross-sectional views of the light-emitting device 300 in accordance with another embodiment of the present disclosure. FIG. 6C illustrates a top view of the light-emitting device 300 without showing an electrical plate 25. The light-emitting device 300 includes a carrier 10" having a top surface 101" and a bottom surface 102" opposite to the top surface 101", a plurality of light-emitting units 13 disposed on the top surface 101", a top electrode 20" on the top surface 101", an electrical plate 25, and a transparent body 103 covering the top electrode 20", the light-emitting units 13 and part of the electrical plate 25. As shown in FIG. 6C, the top electrode 20" includes a first electrode pad 201", a second electrode pad 202", a plurality of first electrode parts 2011", a plurality of second electrode parts 2012", and a third electrode part 2013". The first electrode pad 201" and the second electrode pad 202" are arranged at the same side and the same surface (the top surface). The first electrode part 2011" and the second electrode part 2012" are arranged in a straight line along a length direction of the carrier 10" (X), and physically and alternately spaced apart from each other. The third electrode part 2013" is a straight line and parallel with the first electrode part 2011" and the second electrode part 2012". The top electrode 20" further includes a bended part 2014" which has an end arranged in a straight line with and spaced apart from the second electrode part 2012" while the other end is physically and electrically connected to the third electrode part 2013". The second electrode part 2012" includes a plurality of sub electrode part 20121" spaced apart from each other. In this embodiment, the second electrode part 2012" includes three sub electrode parts 20121" spaced apart from each other by a distance. Referring to FIG. 6A, the light-emitting unit 13 has a first connecting pad (not shown) at a position corresponding to the first electrode part 2011" for electrically connecting therebetween, and the light-emitting unit 13 has a second connecting pad (not shown) at a position corresponding to adjacent first electrode part 2011' for electrically connecting therebetween. The second electrode part 2012" contacts the light-emitting unit 13 but is not electrically connected to the light-emitting unit 13 for dissipating heat from the light-emitting unit 13 to the ambient (air). In another embodiment, the second electrode part 2012" can also be electrically connected to the light-emitting unit 13. As shown in FIGS. 6A, 6B, 6D, and 6E, the electrical plate 25 includes a board 250 having a top surface 251 and a bottom surface 252 opposite to the top surface 251, a first electrode block 253 formed on the top surface 251 and a second electrode block 254 formed on the bottom surface 252. Referring to FIG. 6D, the first electrode block 253 has a first section 2531 and a second section 2532 connecting to the first section 2531. Referring FIG. 6E, the second electrode block 254 has a third section 2541, and a fourth section 2542 without physically connecting to the third section 2541. The second section 2532 and the fourth section 2542 are respectively formed on the top surface 251 and the bottom surface 252 at the position corresponding to each other. A hole 255 penetrates through the board 250 at the second section 2532 and the fourth section 2542 (as shown in FIG. 6A), and a conductive material can be fully or partly filled within the hole 255 for electrically connecting the second section 2532 with the fourth section 2542. The electrical plate 25 is disposed at a position corresponding to the top electrode 20" of the carrier 10", the fourth section 2542 is physically and electrically connected to the first electrode pad 201", the third section 2541 is physically and electrically connected to the second electrode pad 202", and the fourth section 2542 is electrically connected to the first electrode block 253 through the conductive material filled within the hole 255. In operation, a positive node and a negative node of the external source can be electrically connected to the first section 2531 of the first electrode block 253 and the third section 2541 of the second electrode block 254 such that the light-emitting units 13 can emit light. Specifically, the first electrode block 253 is electrically connected to the fourth section 2542 through the conductive material filled within the hole 255, and the fourth section 2542 is physically and electrically connected to the first electrode pad 201", thus the positive node of the external source can be electrically connected to the first electrode pad 201". Likewise, the negative node of the external source can be electrically connected to the second electrode pad 202" through the third section 2541. Since the positive node and the negative node of the external source can be electrically connected to the first electrode block 253 and the second electrode block 254, respectively, and the first electrode block 253 and the second electrode block 254 are respectively arranged on the top surface 251 and the bottom surface 252 of the electrical plate 25, the external source is connected to the electrical plate 25 at the different surfaces (top surface 251 and bottom surface 252) but at the same side. By virtue of the hole 255, the first section 253 is connected to the first electrode pad 201" such that the positive node and the negative node of the external source can be electrically connected to the first electrode pad 201" and the second electrode pad 202", respectively, and the first electrode pad 201" and the second electrode pad 202" are formed on the top surface 101" of the carrier 10", therefore, the external source is connected to the carrier 10" at the same surface (top surface 101") and at the same side. In another embodiment, the first electrode block and the second electrode block can be designed to form on the top surface of the electrical plate and a hole is formed at the first electrode block and the second electrode block. With the conductive material filled within the hole, the first electrode block and the second electrode block are electrically connected to the first electrode pad and the second electrode pad, respectively, therefore, the external source is connected to the electrical plate at the same surface (top surface 101) and at the same side.

It is noted that the sub electrode parts described in FIG. 5A can also be formed in FIGS. 2A, 3A 4A-4E. In other words, there are sub electrode parts formed between the electrode blocks 2031 in FIG. 2A; there are sub electrode parts formed between the first electrode region 2041 and the second electrode region 2042 in FIG. 3A; there are sub electrode parts formed between the electrode zones 2051 in FIG. 4A; there are sub electrode parts formed between the first electrode bar 2061 and the second electrode bar 2062 in FIG. 4B; there are sub electrode parts formed between the first branch 20913 and the second branch 20922 in FIG. 4C; there are sub electrode parts formed between the third branch 31013 and the fourth branch 31023 in FIG. 4D; and there are sub electrode parts formed between the first electrode region 2071, the second electrode region 2072, and the third electrode region 2073. The sub electrode parts contacts the light-emitting unit but is not electrically connected to the light-emitting unit for dissipating heat from the light-emitting unit to the ambient (air). In another embodiment, the sub electrode parts can also be electrically connected to the light-emitting unit.

Figure 7A:
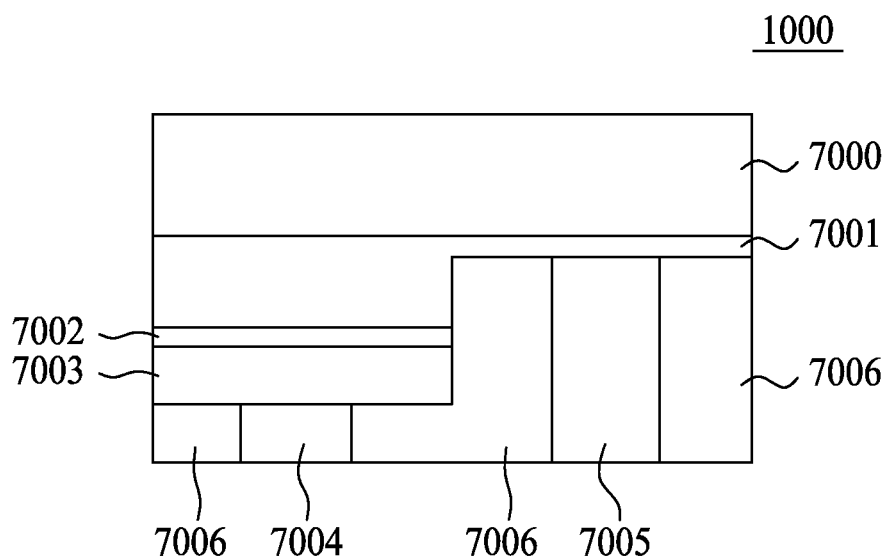
FIG. 7A illustrates a cross-sectional view of a light-emitting diode unit in accordance with one embodiment of the present disclosure.

FIG. 7A illustrates a cross-sectional view of a light-emitting diode unit 1000 in accordance with one embodiment of the present disclosure, which can be used as any one of the light-emitting units 11, 12A, 12B, 13 in FIGS. 1A, 3A, 4A 4F, 5A, 5D, and 6A. The light-emitting diode unit 1000 includes a substrate 7000, a first-type semiconductor layer 7001, an active layer 7002, and a second-type semiconductor layer 7003. The first-type semiconductor layer 7001 and the second-type semiconductor layer 7003, for example a cladding layer or a confinement layer, respectively provide electrons and holes such that electrons and holes can be combined in the active layer 7002 to emit light. A first conductive portion 7004 and a second conductive portion 7005 are formed on the second-type semiconductor layer 7003 and the first-type semiconductor layer 7001, respectively. The light-emitting diode unit 1000 is a flip-chip light-emitting diode unit. In another embodiment, the light-emitting diode unit 1000 can further includes a wavelength conversion material (not shown) formed on the substrate 7000 to convert light emitted by the active layer 7002. In another embodiment, the light-emitting diode unit 1000 is a thin-film light-emitting diode structure without the substrate 7000. Therefore, a wavelength conversion material (not shown) is directly formed on the first-type semiconductor layer 7001. It is noted that when the light-emitting diode unit 1000 is used as any one of the light-emitting units 11, 12A, 12B, 13 in FIGS. 1A, 3A, 4A 4F, 5A, 5D, and 6A, the first conductive portion 7004 acts as the previously described first connecting pad or the second connecting pad, and the second conductive portion 7005 acts as the previously described second connecting pad or the first connecting pad. Accordingly, a connection configuration between the first conductive portion 7004, the second conductive portion 7005, the top electrode or/and the bottom electrode is the same as the connection configuration between the first (second) connecting pad, the second (first) connecting pad, the top electrode or/and the bottom electrode. The light-emitting diode unit 1000 further includes a protective layer 7006 made of a transparent insulation material with a high thermal conductivity coefficient (for example, diamond like carbon) and formed to cover the first-type semiconductor layer 7001, the second-type semiconductor layer 7003, and the active layer 7002. Therefore, when the light-emitting diode unit 1000 is used as the light-emitting units 12A, 12B, 13 in FIGS. 5A and 6A, the protective layer 7006 can contact the electrode part 2012', 3012', 2012" for dissipating heat from the light-emitting diode unit 1000 to the ambient (air). Furthermore, the protective layer 7006 can also include a reflective material therein (for example, $TiO_2$, $SiO_2$, $Al_2O_3$, $ZrO_2$, ZnS, ZnO, or MgO).

Figure 7B:
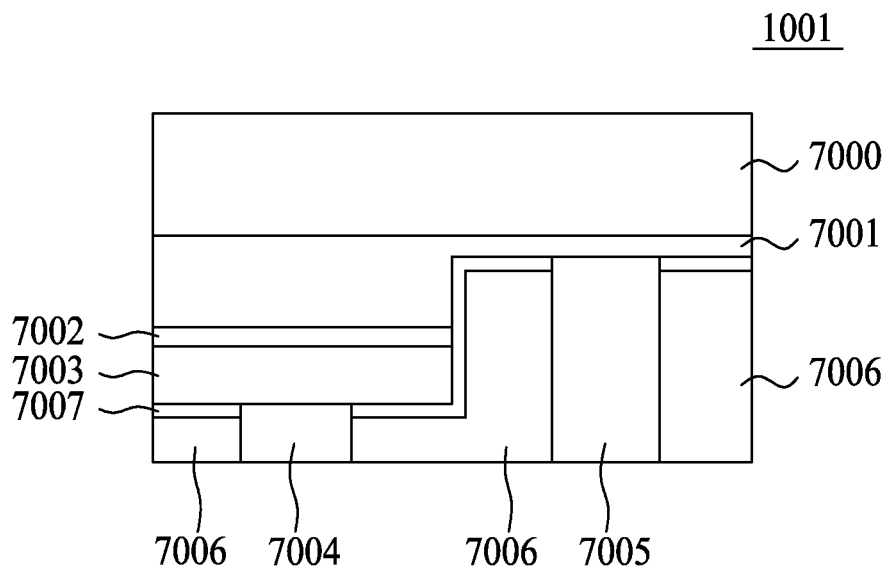
FIG. 7B illustrates a cross-sectional view of a light-emitting diode unit in accordance with another embodiment of the present disclosure.

FIG. 7B illustrates a cross-sectional view of a light-emitting diode unit 1001 in accordance with one embodiment of the present disclosure. The light-emitting diode unit 1001 has a structure similar with the light-emitting diode unit 1000, and can also be used as any one of the light-emitting units 11, 12A, 12B, 13 in FIGS. 1A, 3A, 4A 4F, 5A, and 6A. The devices, elements or steps with similar or the same symbols represent those with the same or similar functions. The light-emitting diode unit 1001 further includes a reflective layer 7007 to cover the first-type semiconductor 7001, the second-type semiconductor 7003, and the active layer 7002. Accordingly, the light emitted from the active layer 7002 is able to be reflected toward the substrate 7000. The light-emitting diode unit 1001 can also include a protective layer 7006 formed on the reflective layer 7007 that is made of a transparent insulation material with a high thermal conductivity coefficient (for example, diamond like carbon). When the light-emitting diode unit 1001 is used as the light-emitting units 12A, 12B, 13 in FIGS. 5A and 6A, the protective layer 7006 can contact the electrode part 2012', 3012', 2012" for dissipating heat from the light-emitting diode unit 1001 to the ambient (air). The reflective layer 7007 comprises insulating material, such as $SiO_x$, $Al_2O_3$, $TiO_2$ or combinations thereof.

Figure 7C:
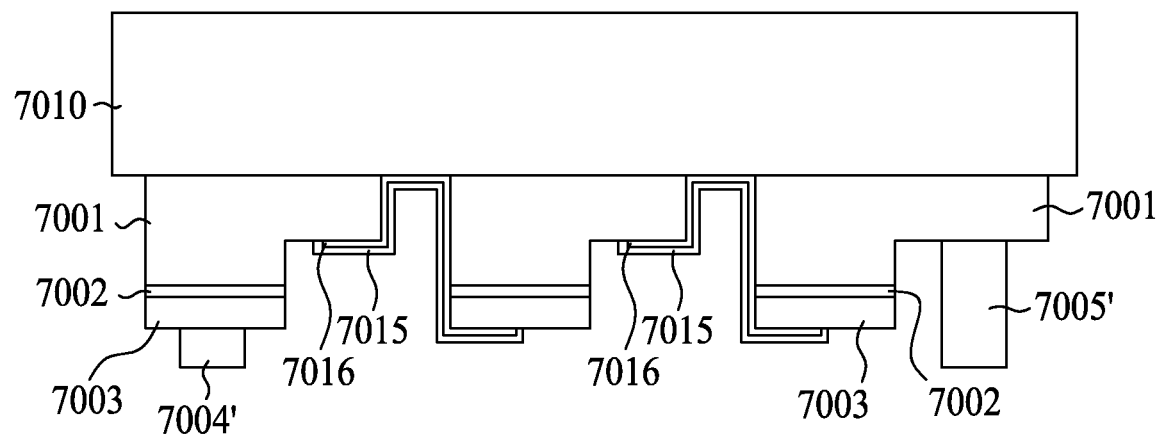
FIG. 7C illustrates a cross-sectional view of a light-emitting diode unit in accordance with another embodiment of the present disclosure.

FIG. 7C illustrates a cross-sectional view of a light-emitting diode unit 1002 in accordance with one embodiment of the present disclosure. The light-emitting diode unit 1002 has a structure similar with the light-emitting diode unit 1000 and can also be used as any one of the light-emitting unit 11, 12A, 12B, 13 in FIGS. 1A, 3A, 4A 4F, 5A, and 6A. The devices, elements or steps with similar or the same symbols represent those with the same or similar functions. The light-emitting diode unit 1000 merely includes a light-emitting diode; however, the light-emitting diode unit 1002 includes a plurality of light-emitting diodes commonly formed on a common substrate 7010. The light-emitting diodes are physically spaced apart from each other on the common substrate 7010 and a conductive structure 7015 is provided to electrically connect the light-emitting diodes with each other in series, in parallel or in series-parallel such that the light-emitting diode unit 1002 is capable of operating in a high voltage (an operating voltage (such as 6V, 12V, 24V, 36V, or 45V) is larger than the forward voltage of a light-emitting diode (about 3V)). In this embodiment, the light-emitting diode unit 1002 includes three light-emitting diodes and has an operating voltage of about 9V (3V*3=9V). An insulation layer 7016 formed between the light-emitting diodes and the conductive structure 7015 for avoiding an undesired electrical path. In another embodiment, as shown in FIGS. 7A and 7B, the light-emitting diode unit 1002 con includes a protective layer (not shown) for covering the first-type semiconductor 7001, the second-type semiconductor 7003, the active layer 7002 and the conductive structure 7015. Alternatively, a reflective layer (not shown) is provided to cover the first-type semiconductor 7001, the second-type semiconductor 7003, and the active layer 7002. Accordingly, the light emitted from the active layer 7002 is able to be reflected toward the substrate 7000. Likewise, when the light-emitting diode unit 1002 is used as the light-emitting unit 12A, 12B, 13 in FIGS. 5A and 6A, the protective layer 7006 can contact the electrode part 2012', 3012', 2012" for dissipating heat from the light-emitting diode unit 1002 to the ambient (air). It is noted that the light-emitting diode unit 1002 merely has one first conductive portion 7004' formed on the second-type semiconductor layer 7003 of one light-emitting diode and one second conductive portion 7005' are formed on the first-type semiconductor layer 7001 of another light-emitting diode. When the light-emitting diode unit 1002 is used as the light-emitting unit 11, 12A, 12B, 13 in FIGS. 1A, 3A, 4A 4F, 5A, 5D, and 6A, the first conductive portion 7004' acts as the previously described first connecting pad or the second connecting pad, and the second conductive portion 7005' acts as the previously described second connecting pad or the first connecting pad. Accordingly, a connection configuration between the first conductive portion 7004', the second conductive portion 7005', the top electrode or/and the bottom electrode is the same as the connection configuration between the first (second) connecting pad, the second (first) connecting pad, the top electrode or/and the bottom electrode. By connecting the first conductive portion 7004' and the second conductive portion 7005' to the external source, all the light-emitting diodes can emit light. The reflective layer 7007 includes an insulating material, such as SiO$_x$, Al$_2$O$_3$, TiO$_2$ or combinations thereof.

Figure 7D:
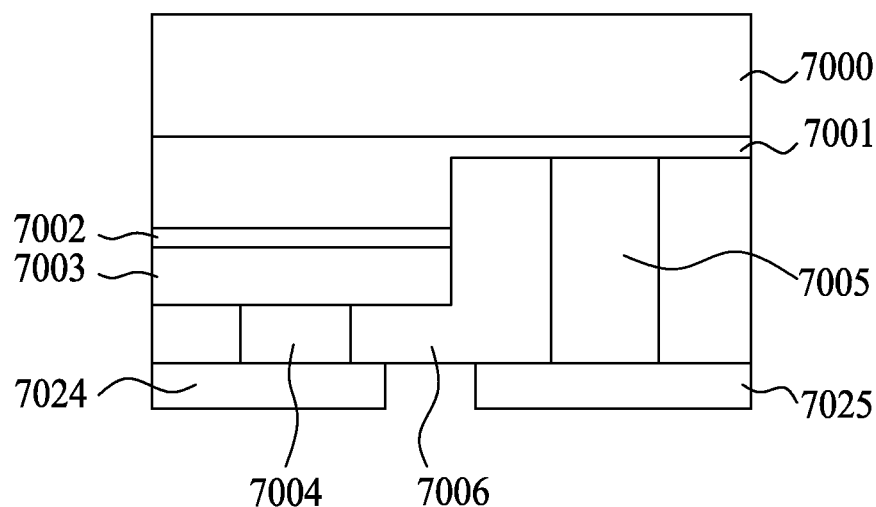
FIG. 7D illustrates a cross-sectional view of a light-emitting diode unit in accordance with another embodiment of the present disclosure.

FIG. 7D illustrates a cross-sectional view of a light-emitting diode unit 1003 in accordance with one embodiment of the present disclosure. The light-emitting diode unit 1003 has a structure similar with the light-emitting diode unit 1000 and can also be used as any one of the light-emitting units 11, 12A, 12B, 13 in FIGS. 1A, 3A, 4A 4F, 5A, and 6A. The devices, elements or steps with similar or the same symbols represent those with the same or similar functions. The light-emitting diode unit 1003 further includes a first expansion electrode portion 7024 that is physically and electrically connected to the first conductive portion 7004, and that has an area greater than that of the first conductive portion 7004; and a second expansion electrode portion 7025 that is physically and electrically connected to the second conductive portion 7005 and that has an area greater than that of the second conductive portion 7005. Likewise, when the light-emitting diode unit 1003 is used as the any one of light-emitting units 11, 12A, 12B, 13 in FIGS. 1A, 3A, 4A 4F, 5A, 5D, and 6A, the first expansion electrode portion 7024 acts as the previously described first (second) connecting pad, and the second expansion electrode portion 7025 acts as the previously described second (first) connecting pad. Accordingly, a connection configuration between the first expansion electrode portion 7024, the second expansion electrode portion 7025, the top electrode or/and the bottom electrode is the same as the connection configuration between the first (second) connecting pad, the second (first) connecting pad, the top electrode or/and the bottom electrode. In this embodiment, the first expansion electrode portion 7024 and the second expansion electrode portion 7025 are provided for facilitating a subsequent alignment process.

Figure 8A:
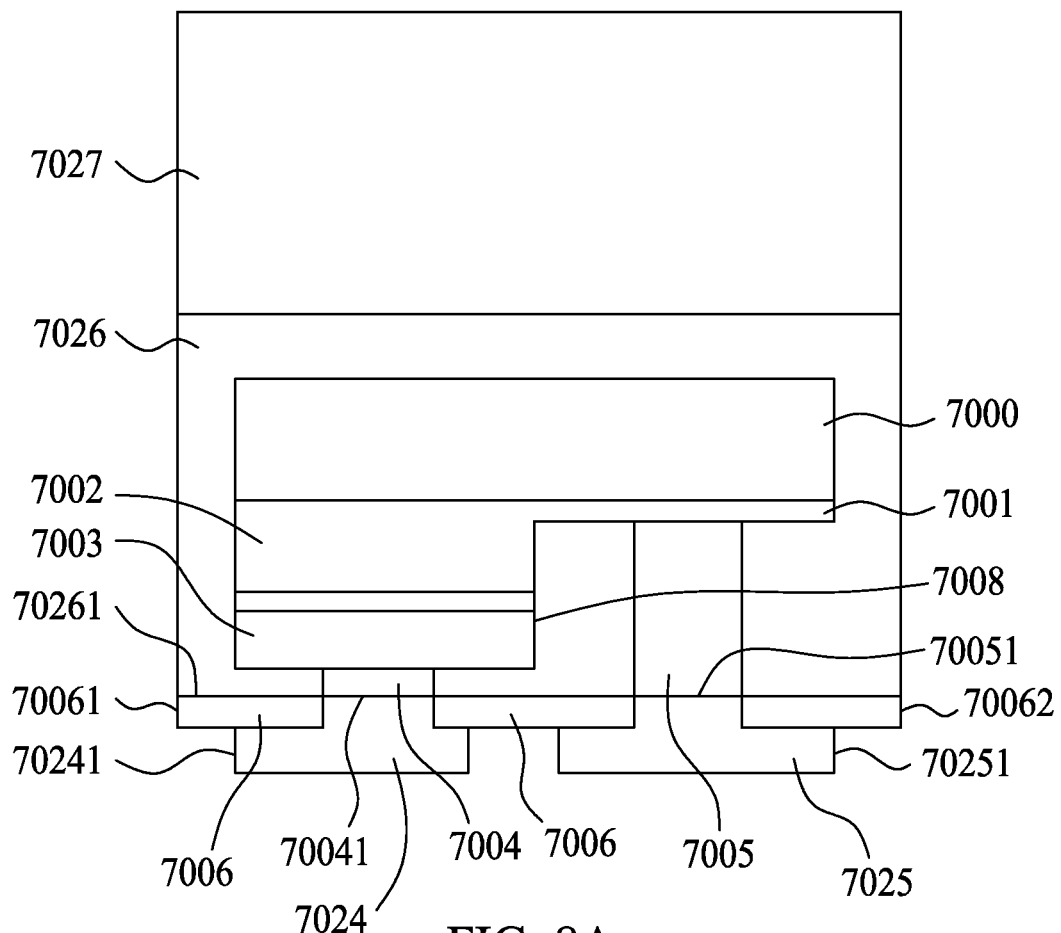
FIG. 8A illustrates a cross-sectional view of a light-emitting diode unit in accordance with another embodiment of the present disclosure.

FIG. 8A illustrates a cross-sectional view of a light-emitting diode unit 2000 in accordance with one embodiment of the present disclosure, which can be used as any one of the light-emitting units 11, 12A, 12B, 13 in FIGS. 1A, 3A, 4A 4F, 5A, 5D, and 6A. The light-emitting diode unit 2000 has a structure similar with the light-emitting diode unit 1003. The devices, elements or steps with similar or the same symbols represent those with the same or similar functions. The light-emitting diode unit 2000 includes a substrate 7000, a first-type semiconductor layer 7001, an active layer 7002 and a second-type semiconductor layer 7003. The first-type semiconductor layer 7001 and the second-type semiconductor layer 7003, for example a cladding layer or a confinement layer, respectively provide electrons and holes such that electrons and holes can be combined in the active layer 7002 to emit light. A first conductive portion 7004 and a second conductive portion 7005 are formed on the second-type semiconductor layer 7003 and the first-type semiconductor layer 7001, respectively. The light-emitting diode unit 2000 is a flip-chip light-emitting diode unit. A space 7008 is formed between the first conductive portion 7004 and the second conductive portion 7005. The first conductive portion 7004 has a contact surface 70041 and the second conductive portion 7005 has a contact surface 70051 substantially coplanar with the contact surface 70041. A transparent substance covers the substrate 7000, the first-type semiconductor layer 7001, the active layer 7002 and the second-type semiconductor layer 7003 and further fully fills into the space 7008 to form a first transparent structure 7026. In another embodiment, the transparent substance does not fully fill the space 7008, and there may have air between the first conductive portion 7004 and the second conductive portion 7005. The first transparent structure 7026 has a surface 70261 substantially coplanar with the contact surface 70041, 70051. Subsequently, the protective layer 7006 formed on a surface of the first transparent structure 7026 to expose the first conductive portion 7004 and the second conductive portion 7005. A first expansion electrode portion 7024 and a second expansion electrode portion 7025 formed on and electrically connected to the first conductive portion 7004 and the second conductive portion 7005, respectively, and further formed on the protective layer 7006. In this embodiment, the first expansion electrode portion 7024 has a sidewall 70241 not coplanar with a sidewall 70061 of the protective layer 7006; the second expansion electrode portion 7025 has a sidewall 70251 not coplanar with another sidewall 70062 of the protective layer 7006. In other embodiment, the sidewall 70241 of the first expansion electrode portion 7024 can be coplanar with a sidewall 70061 of the protective layer 7006; the sidewall 70251 of the second expansion electrode portion 7025 can be coplanar with the another sidewall 70062 of the protective layer 7006. The light-emitting diode unit 2000 further includes a second transparent structure 7027 formed on the first transparent structure 7026. The first transparent structure 7026 includes silicone, epoxy, polyimide (PI), BCB, perfluorocyclobutane (PFCB), SU8, acrylic resin, polymethyl methacrylate (PMMA), polyethylene terephthalate (PET), polycarbonate (PC), polyetherimide, fluorocarbon polymer, Al$_2$O$_3$, SINR, or spin-on-glass (SOG). The second transparent structure 7027 can include sapphire, diamond, glass, epoxy, quartz, acryl resin, SiO$_x$, Al$_2$O$_3$, ZnO, silicone, and/or any combination thereof.

Figure 8B:
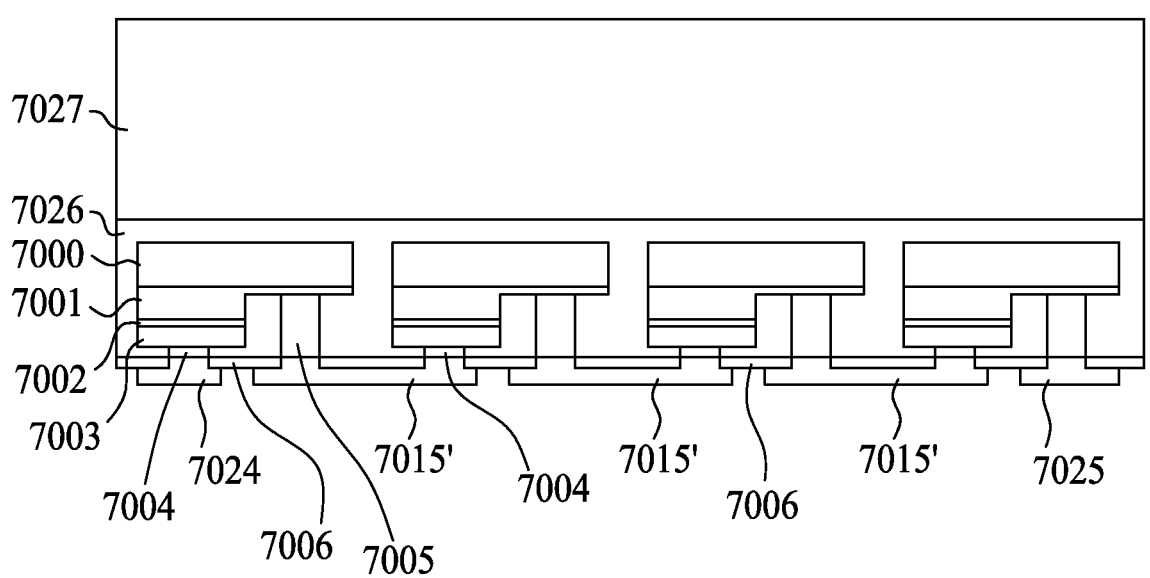
FIG. 8B illustrates a cross-sectional view of a light-emitting diode unit in accordance with another embodiment of the present disclosure.
Figure 8C:
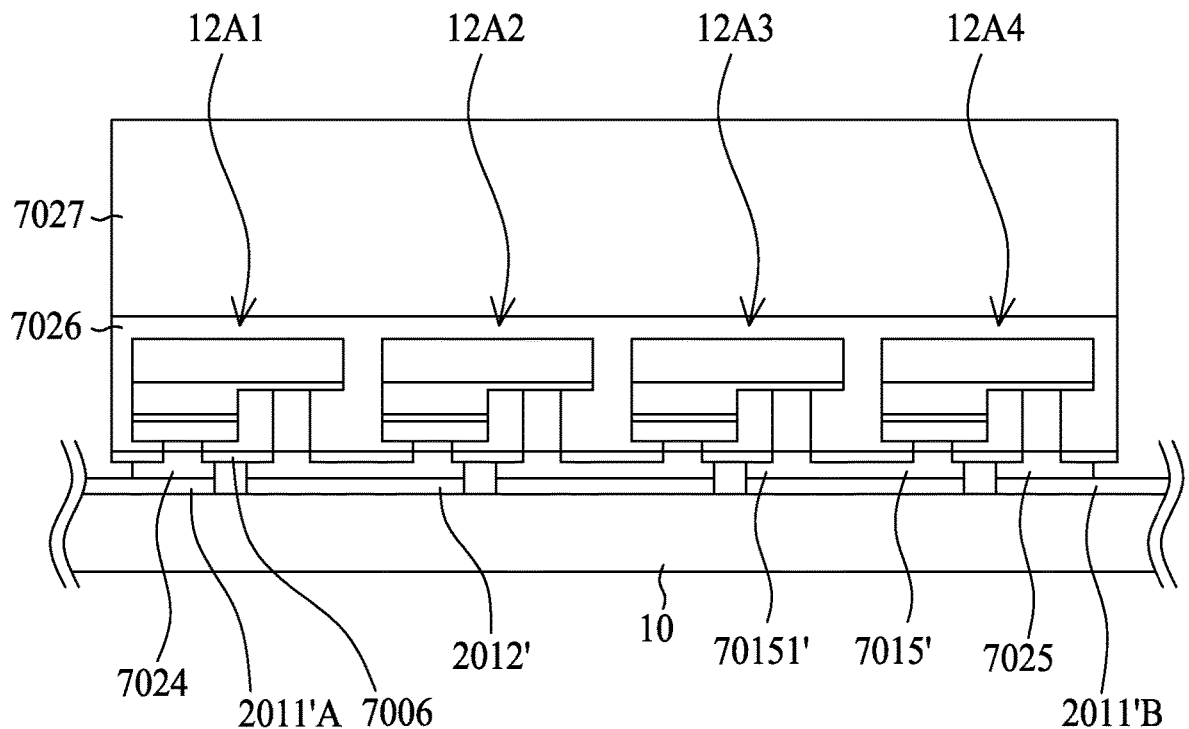
FIG. 8C illustrates a partial cross-sectional view of the light-emitting diode unit of FIG. 8A embodied in FIG. 5A.

FIG. 8B illustrates a cross-sectional view of a light-emitting diode unit 2001 in accordance with one embodiment of the present disclosure, which can be used as any one of the light-emitting units 11, 12A, 12B, 13 in FIGS. 1A, 3A, 4A 4F, 5A, 5D, and 6A. The light-emitting diode unit 2001 has a structure similar with the light-emitting diode unit 2000. The devices, elements or steps with similar or the same symbols represent those with the same or similar functions. The light-emitting diode unit 2000 merely includes a light-emitting diode; however, the light-emitting diode unit 2001 includes a plurality of light-emitting diodes. In this embodiment, each of the light-emitting diodes has a respective substrate, but in another embodiment, as shown in FIG. 7C, the light-emitting diodes can be commonly formed on a substrate. The light-emitting diodes are electrically connected to each other (in series, in parallel or in series-parallel) through a conductive structure 7015'. In this embodiment, the conductive structure 7015' physically and electrically connects the second conductive portion 7005 of one light-emitting diode with the first conductive portion 7004 of adjacent light-emitting diode in series. The transparent structure 7026 covers the light-emitting units. It is noted that when the light-emitting diode unit 2001 is used as any one of the light-emitting units 11, 12A, 12B, 13 in FIGS. 1A, 3A, 4A 4F, 5A, 5D, and 6A, the first expansion electrode portion 7024 acts as the previously described first (second) connecting pad, and the second expansion electrode portion 7025 acts as the previously described second (first) connecting pad. Accordingly, a connection configuration between the first expansion electrode portion 7024, the second expansion electrode portion 7025, the top electrode or/and the bottom electrode is the same as the connection configuration between the first (second) connecting pad, the second (first) connecting pad, the top electrode or/and the bottom electrode. By connecting the first expansion electrode portion 7024 and the second expansion electrode portion 7025 to the external source, the light-emitting diodes can emit light. FIG. 8C is a partially cross-sectional view where the light-emitting diode unit 2001 is applied in the light-emitting device of FIG. 5. In this embodiment, only one light-emitting diode unit 2001 is shown to be disposed on the carrier 10. The light-emitting diode unit 2001 includes four light-emitting diodes 12A1, 12A2, 12A3, 12A4. The first expansion electrode portion 7024 merely covers partial of the first electrode part 2011'A and the second expansion electrode portion 7025 and merely cover partial of the first electrode part 2011'B. The conductive structure 7015' includes a plurality of sub conductive structures 70151' which all are not physically connected to the first electrode parts 2011'A, 2011'B. The first electrode part 2011'A is merely physically connected to the light-emitting diodes 12A1, the second electrode part 2012' is physically connected to the light-emitting diodes 12A1, 12A2, 12A3, 12A4, and the first electrode part 2011'B is merely physically connected to the light-emitting diodes 12A4. The first transparent structure 7026 merely cover partial of the first electrode part 2011'A, 2011'B but cover full of the second electrode part 2012'. A protective layer 7006 is formed between the conductive structure 7015' and the first transparent structure 7026. The conductive structure 7015' can be physically connected to the electrode part 2012' (3012') for dissipating heat from the light-emitting diode unit 2001 to the ambient (air). Similarly, the light-emitting diode unit 2001 can also be used as the light-emitting unit 13 in FIG. 6A. Alternatively, when the light-emitting device of the aforesaid embodiments further has sub electrode parts, the light-emitting diode unit 2001 can still be used as any one of the light-emitting unit of these light-emitting devices. In this embodiment, the conductive structure 7015' includes Au, Al, Cu, or Pt, and is electrically connected to the electrode part 2012' (3012', 2012"). The conductive structure 7015' has a shape or area as the same as that of the electrode part 2012' (3012', 2012"). Referring to FIGS. 5A, 8C (6A), the electrode part 2012' (3012', 2012") has three sub electrode parts 20121' (30121', 20121") and the conductive structure 7015' has three sub conductive structures 70151', that is, the amount of the sub electrode parts is equal to (corresponding to) the sub conductive structures. In other embodiment, the sub conductive structure 70151' has an area smaller than that of the corresponding sub electrode part.

Figure 8D:
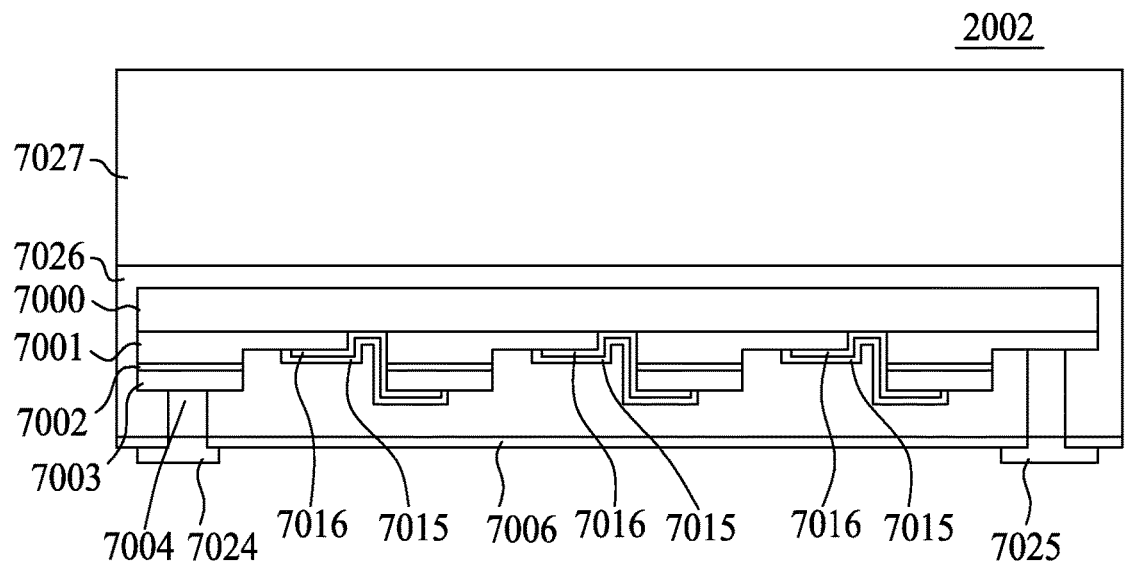
FIG. 8D illustrates a cross-sectional view of a light-emitting diode unit in accordance with another embodiment of the present disclosure.

FIG. 8D illustrates a cross-sectional view of a light-emitting diode unit 2002 in accordance with one embodiment of the present disclosure, which can be used as any one of the light-emitting units 11, 12A, 12B, 13 in FIGS. 1A, 3A, 4A 4F, 5A, 5D, and 6A. The devices, elements or steps with similar or the same symbols represent those with the same or similar functions. The light-emitting diode unit 2001 includes a plurality of light-emitting diodes commonly formed on a common substrate 7000. The light-emitting diodes are physically spaced apart from each other on the common substrate 7000 and a conductive structure 7015 is provided to electrically connect the light-emitting diodes with each other in series, in parallel or in series-parallel such that the light-emitting diode unit 2002 is capable of operating in a high voltage (an operating voltage (such as 6V, 12V, 24V, 36V, or 45V) larger than the forward voltage of a light-emitting diode (about 3V)). In this embodiment, the light-emitting diode unit 2002 includes four light-emitting diodes and has an operating voltage of about 12V (3V*4=12V). An insulation layer 7016 is formed between the light-emitting diodes and the conductive structure 7015 for avoiding an undesired electrical path. It is noted that the light-emitting diode unit 2002 merely has one first conductive portion 7004 formed on the second-type semiconductor layer 7003 of one light-emitting diode and one second conductive portion 7005 formed on the first-type semiconductor layer 7001 of another light-emitting diode. When the light-emitting diode unit 2002 is used as any one of the light-emitting units 11, 12A, 12B, 13 in FIGS. 1A, 3A, 4A 4F, 5A, 5D, and 6A, the first conductive portion 7004 acts as the previously described first connecting pad or the second connecting pad, and the second conductive portion 7005 acts as the previously described second connecting pad or the first connecting pad. Accordingly, a connection configuration between the first conductive portion 7004, the second conductive portion 7005, the top electrode or/and the bottom electrode is the same as the connection configuration between the first (second) connecting pad, the second (first) connecting pad, the top electrode or/and the bottom electrode. By connecting the first conductive portion 7004 and the second conductive portion 7005 to the external source, all the light-emitting diodes can emit light. The first transparent structure 7026 covers all the light-emitting units.

Figure 8E:
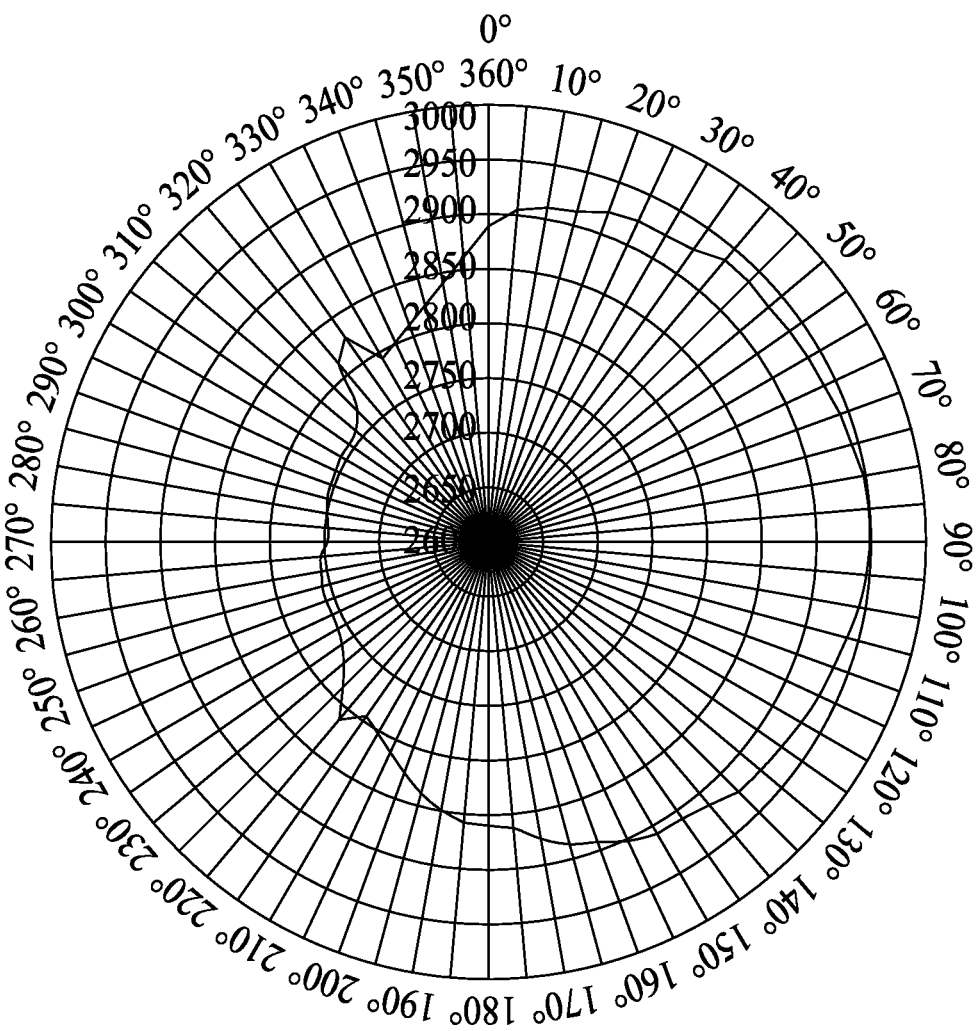
FIG. 8E illustrates a correlated color temperature spatial distribution of light emitted from a light-emitting diode unit in accordance with another embodiment of the present disclosure.

The aforesaid light-emitting diode units 1000, 1001, 1002, 2000, 2001, 2002 having the protective layer or/and the reflective layer can emit light from the light-emitting diode unit toward the substrate which is substantially defined as a five-surface light-emitting diode unit. When the light-emitting units 11, 13 are merely arranged on the top surface 101, 101" of the carrier 10, 10" (shown in FIGS. 1A, 3A, 4A 4F, 6A) and includes a transparent body 103 having the wavelength conversion layer dispersed in and formed on the light-emitting units 11, 13 and portion of the carrier, portion of the light (ex. blue light) emitted from the light-emitting unit is converted to another light (ex. yellow or yellowish-green light) by the wavelength conversion layer. The blue light is mixed with the yellow light (or yellowish-green light) to form a white light. In other embodiment, the light-emitting diode unit includes a wavelength conversion material for converting the light emitted by the active layer, thus the transparent body 103 does not includes the wavelength conversion layer. In this embodiment, the carrier is a transparent or semi-transparent. Portions of the white light can be scattered or reflected by the particles within the wavelength conversion layer (or the wavelength conversion material) to be incident on the transparent or semi-transparent carrier such that the white light not only emits outwardly through a side (top surface) of the transparent carrier on which the light-emitting unit is arranged, but also emits outwardly through a side surface and a bottom surface of the transparent carrier, which indicates the white light can emit outwardly through all surfaces of the carrier (defined as a six-surface light-emitting device). In addition, a diffusing powder (ex. TiO$_2$) is optionally added into the wavelength conversion layer (or the wavelength conversion material) for increasing the possibility in which the white light progresses downward. In short, in this embodiment, an approximately uniform light distribution (can be seen from a six-surface light-emitting device) can be achieved by using a non-uniform light source (such as five-surface light-emitting diode). Furthermore, the white light at the side of the transparent carrier on which the light-emitting unit is arranged (top surface) has a first average correlated color temperature (CCT); the white light at another side of the transparent carrier (bottom surface) has a second average correlated color temperature less than the first average correlated color temperature. A difference of the first average correlated color temperature and the second average correlated color temperature is not smaller than 50K and not greater than 300K. To be specific, the light-emitting device is disposed on a black base with the top surface facing upward and is electrically connected to the external source. When the light-emitting device emits light, a Chroma Meter (for example, UPRtek, MK350) is used to measure the correlated color temperature to obtain the first average correlated color temperature. Hereinafter, the light-emitting device is provided with its bottom surface facing upward and is electrically connected to the external source. When the light-emitting device emits light, the second average correlated color temperature is measured. Alternatively, a goniophotometer is used to obtain the correlated color temperature of the white light at any point in a space. For example, the light-emitting device is viewed as a central point, and a correlated color temperature spatial distribution of the light emitted from the light-emitting device is shown in FIG. 8E (0° ~360°). The spatial angle at the top surface of the carrier (with the light-emitting unit) is defined as 0° ~180° and the spatial angle at the bottom surface of the carrier (without the light-emitting unit) is defined as 180° ~360°. In the range of 0° ~180°, the correlated color temperature at any angle is measured to obtain a first correlated color temperature; in the range of 180° ~360°, the correlated color temperature at any angle is measured to obtain a second correlated color temperature; the first correlated color temperature is greater than the second correlated color temperature and a different of the first correlated color temperature and the second correlated color temperature is not smaller than 50K and not greater than 300K. As shown in FIG. 8E, within the range of 180°~360°, the correlated color temperature in the range of 210°~225° and 315°~300° is higher. In addition, the average correlated color temperature at the top surface (0°~180°) is greater than that at the bottom surface (180°~360°).

Figure 9:
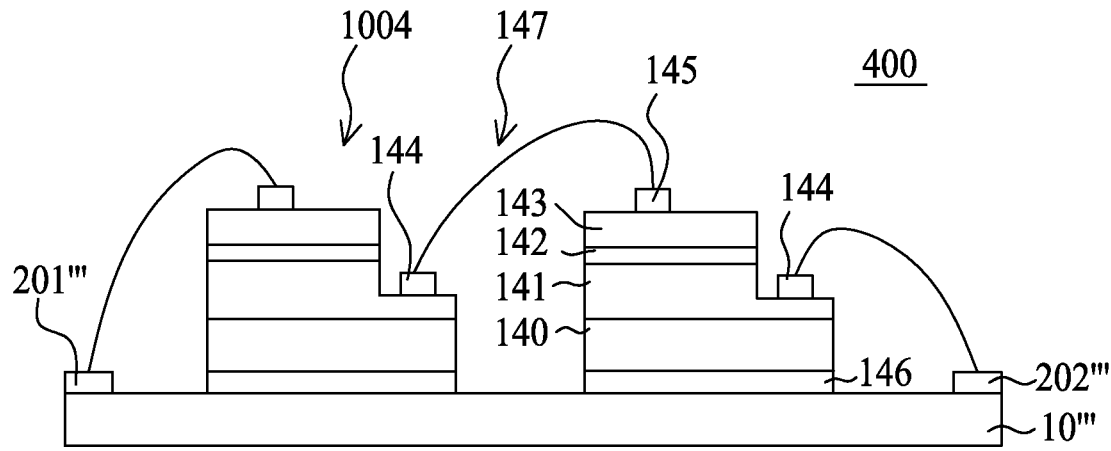
FIG. 9 illustrates a cross-sectional view of a light-emitting device in accordance with another embodiment of the present disclosure.

FIG. 9 illustrates a cross-sectional view of a light-emitting device 400 in accordance with another embodiment of the present disclosure. The light-emitting device 400 includes a transparent carrier 10''', a plurality of light-emitting diode units 1004 disposed on the transparent carrier 10''', a first electrode pad 201''' and a second electrode pad 202'''. The light-emitting diode unit 1004 includes a substrate 140, a first-type semiconductor layer 141, an active layer 142 and a second-type semiconductor layer 143. The first-type semiconductor layer 141 and the second-type semiconductor layer 143, for example a cladding layer or a confinement layer, respectively provide electrons and holes such that electrons and holes can be combined in the active layer 142 to emit light. The light-emitting diode unit 1004 further includes a first bonding pad 144 formed on the first-type semiconductor layer 141 and a second bonding pad 145 formed on the second-type semiconductor layer 143. The light-emitting diode unit 1004 includes a reflective structure 146 formed between the substrate 140 and the carrier 10''' for reflecting the light from the light-emitting diode unit 1004 toward the bonding pad, which is substantially defined as a five-surface light-emitting diode unit. A wire 147 connects the first bonding pad 144 of one light-emitting diode unit 1004 with the second bonding pad 145 of adjacent light-emitting diode unit 1004 in series. Moreover, the wire 147 further connects the light-emitting diode unit 1004 with the first electrode pad 201''' and the second electrode pad 202'''. When the light-emitting device 400 is connected to the external source (power supply), a positive node and a negative node of the external source is electrically connected to the first electrode pad 201''' and the second electrode pad 202''', respectively, such that the light-emitting diode unit 1004 can emit light. Similarly, since a transparent body 103 including a wavelength conversion layer (not shown) can be formed on the light-emitting diode unit 1004 and portions of the transparent carrier 10'''. Portion of the light (ex. blue light) emitted from the light-emitting diode unit 1004 is converted to another light (ex. yellow or yellowish-green light) by the wavelength conversion layer. The blue light is mixed with the yellow light (or yellowish-green light) to form a white light. Portions of the white light can be scattered or reflected by the particles within the wavelength conversion layer to be incident on the transparent carrier such that the white light not only emits outwardly through a side (top surface) of the transparent carrier on which the light-emitting unit is arranged, but also emits outwardly through side surface and a bottom surface of the transparent carrier, which indicates the white light can emit outwardly through all surfaces (defined as a six-surface light-emitting device). In addition, a diffusing powder (ex. $TiO_2$) is optionally added into the wavelength conversion layer (or the wavelength conversion material) for increasing the possibility in which the white light progresses downward. In short, in this embodiment, an approximately uniform light distribution (can be seen from a six-surface light-emitting device) can be achieved by using a non-uniform light source (such as five-surface light-emitting diode). In other embodiment, a wavelength conversion material is directly formed on the second-type semiconductor layer 143 for converting the light emitted by the active layer, thus the transparent body 103 does not includes the wavelength conversion layer. The reflective layer can be a single layer or a multilayer structure made of one or more conductive material or insulating material. The conductive material includes Ag, Al, Ni. Cu, Au, Ti, or combinations thereof. The insulating material includes epoxy, $SiO_x$, $Al_2O_3$, $TiO_2$, silicone, resin or combinations thereof.

It is noted that the carrier 10, 10', or 10''' is transparent or non-transparent to the light emitted by the light-emitting units 11, 12A, 12B, 13 depending on actual requirements. When the carrier is transparent, it can be glass (n (refractive index)=1.4~1.7), SiC, diamond, epoxy, quartz, acryl resin, $SiO_x$, $Al_2O_3$, ZnO, silicone or combinations thereof. The glass can include Soda-Lime Glass, Alumino Silicate Glass, or low alkaline glass. When the carrier is non-transparent, it can be circuit board with a core board made of a metal, a thermoplastic material, a thermosetting material or a ceramic material. The metal includes Al or Cu. The thermosetting material includes phonetic, epoxy, bismaleimide triazine, or combinations thereof. The thermoplastic material includes polyimide resin, or polytetrafluorethylene. The ceramic material includes $Al_2O_3$, AlN, or AlSiC. The top electrode and the bottom electrode can include Au, Al, Cu, Ag or combinations thereof. In another embodiment, the carrier is made of a flexible material such as polyimide. The transparent body 103 is transparent or semi-transparent to the light emitted by the light-emitting units 11, 12A, 12B, 13.

Figure 10A:
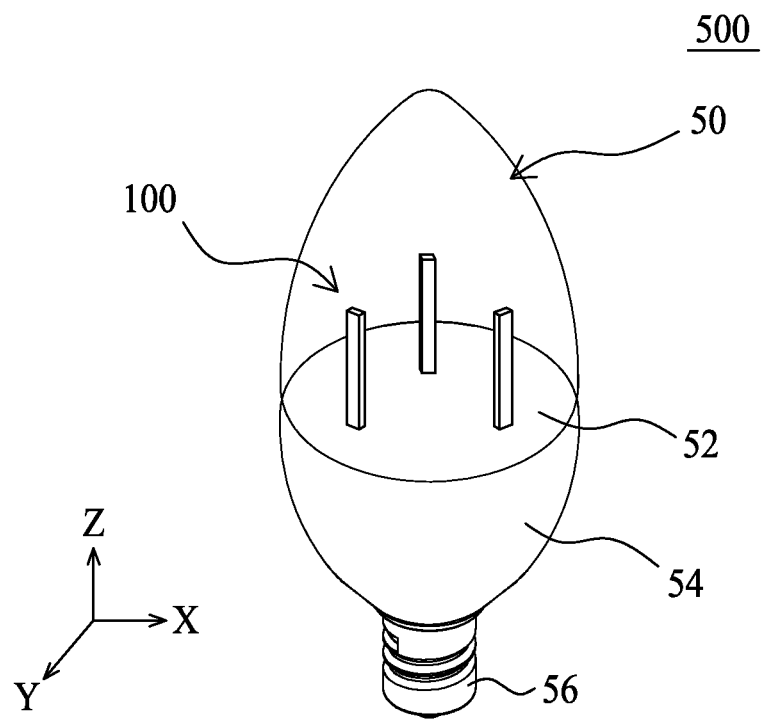
FIG. 10A illustrates a perspective view of an LED bulb in accordance with one embodiment of the present disclosure.
Figure 10B:
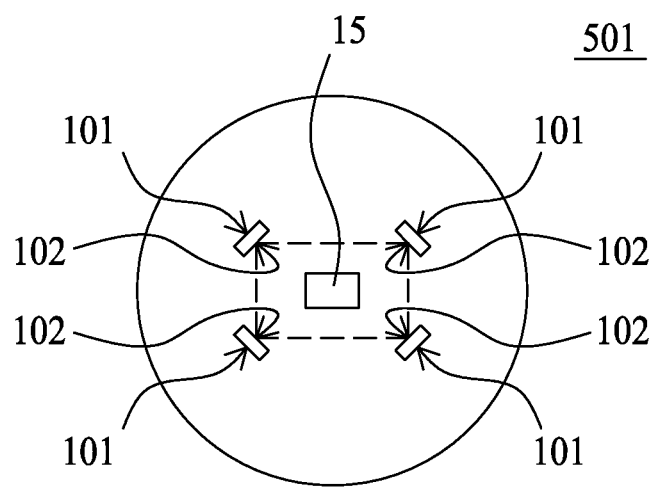
FIG. 10B illustrates a top view of a circuit board on which a light-emitting device is mounted in accordance with one embodiment of the present disclosure.

FIG. 10A illustrates a perspective view of an LED bulb 500 in accordance with an embodiment of the present disclosure. The LED bulb 500 includes a cover 50, a light-emitting device 100, a circuit board 52, a heat sink 54, and an electrical connector 56. The light-emitting device 100 can be replaced by the light-emitting device 200, 300 and the light-emitting device 200, 300 can be applied in the light-emitting bulb 500. The light-emitting device 100 can be viewed as a light filament. When the light-emitting device 100 is mounted on the circuit board 52, the carrier 10 is connected to the circuit board 52 through the same side but different surfaces (see FIG. 1C) thereof. Alternatively, by the electrical plate 25, the external source is connected to the carrier 10 at the same surface but at two opposite sides (see FIGS. 6A 6E). The circuit board 52 is mounted on the heat sink 54 for dissipating heat generated by the light-emitting device 100 away therefrom in a conduction, convection or radiation method. The electrical connector 56 is connected to the heat sink 54, and also connected to the external source. In this embodiment, the light-emitting devices are substantially disposed on the circuit board 52 in a vertical direction (Z) and arranged in a triangular pattern (from the top view). In other embodiment, the light-emitting devices can be arranged in a rectangular pattern, a polygonal pattern or an approximate circle pattern. FIG. 10B illustrates a top view of a circuit board on which the light-emitting devices are mounted in accordance with an embodiment of the present disclosure. The light-emitting devices 100 are arranged in a quadrangular pattern while the top surfaces 101 of each carrier (with the light-emitting units) face outwardly and the bottom surfaces of each carrier (without the light-emitting units) face each other. The LED bulb 501 further includes a light-emitting unit 15 disposed in an interior space defined by the quadrangular pattern and surrounding by the light-emitting devices 100. The light-emitting unit 15 substantially emits light along the Z direction (see FIG. 10A). It is noted that the light-emitting device 100 emits white light and the light-emitting unit 15 emits red light so this configuration can improve the color rendering (CRI≥90) or the Color Quality Scale (CQS≥85). Any one of the light-emitting diode unit 1000, 1001, 1002, 1003, 2000, 2001, 2002 can be used as the light-emitting unit 15.

Figure 11A:
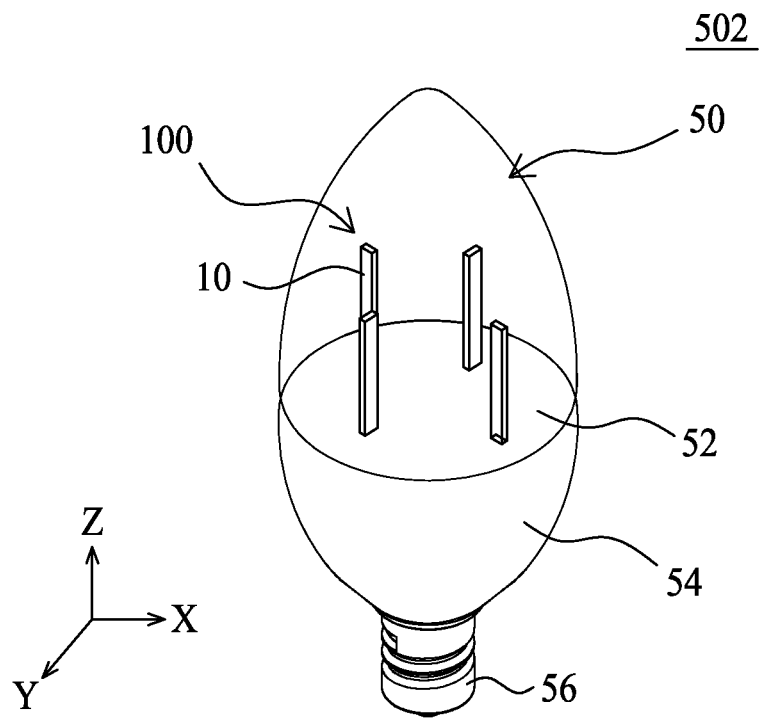
FIG. 11A illustrates a perspective view of an LED bulb in accordance with one embodiment of the present disclosure.
Figure 11B:
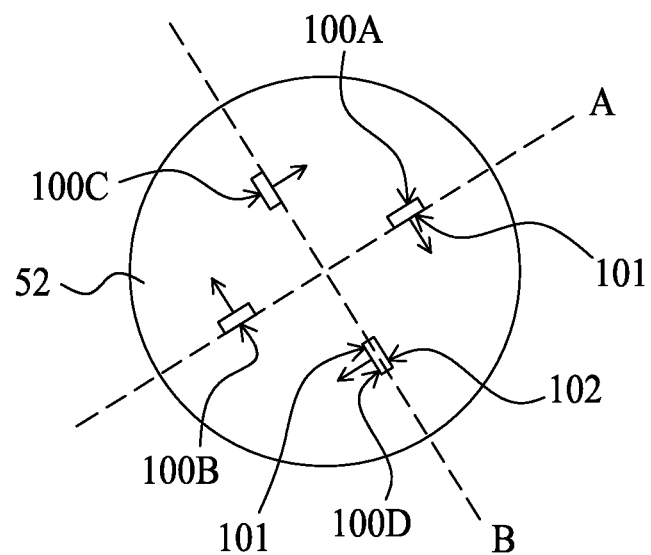
FIG. 11B illustrates a top view of FIG. 11A.
Figure 11C:
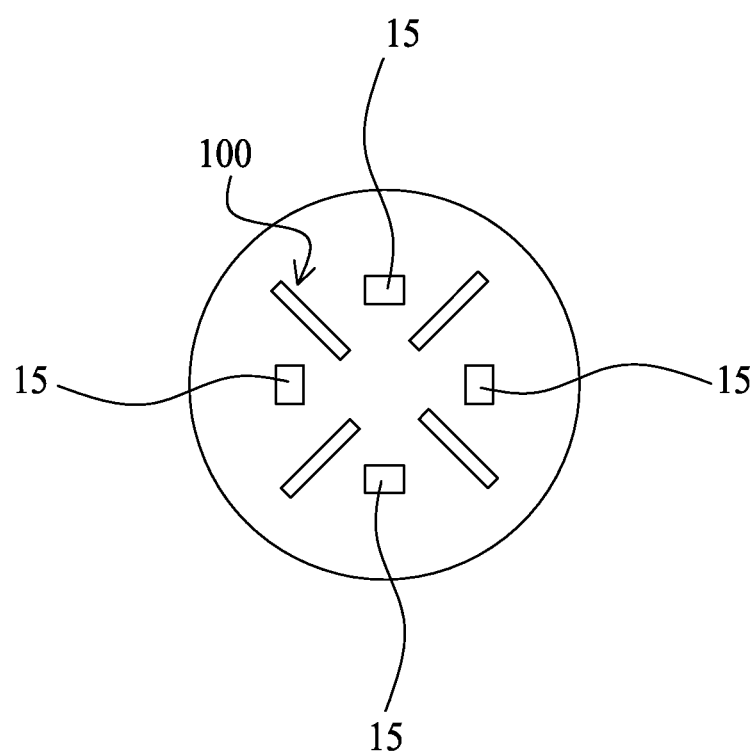
FIG. 11C illustrates a top view of a circuit board on which a light-emitting device is mounted in accordance with one embodiment of the present disclosure.

FIG. 11A illustrates a perspective view of an LED bulb 502 in accordance with another embodiment of the present disclosure. FIG. 11B illustrates a top view of FIG. 11A. The LED bulb 502 is similar with the LED bulb 501. The devices, elements or steps with similar or the same symbols represent those with the same or similar functions. The light-emitting devices 100 are substantially disposed on the circuit board 52 in a vertical direction (Z) and arranged in a quadrangular pattern (from the top view). The light-emitting device 200, 300 can also be applied in this embodiment. In other embodiment, the light-emitting devices can be arranged in a rectangular pattern, a polygonal pattern or an approximate circle pattern. Referring to FIG. 11B, the light-emitting devices 100A, 100B are arranged along the first direction (A) in a straight line with a width direction parallel with the first direction. The light-emitting devices 100C, 100D are arranged along the second direction (B) in a straight line with a width direction parallel with the second direction. The first direction is, but not limited to, substantially perpendicular to the second direction. An angle between the first direction and the second direction can be 30°, 45° or 60°. Each top surface 101 (with the light-emitting unit) of the light-emitting units 100A, 100B has a normal vector perpendicular to the first direction (A) and the two normal vectors point in opposite directions from each other (see arrow). Likewise, each top surface 101 (with the light-emitting unit) of the light-emitting units 100C, 100D has a normal vector perpendicular to the second direction (B) and the two normal vectors point in opposite directions from each other (see the arrow). Furthermore, the emitting direction (see the arrow) of the light-emitting devices 100A, 100B, 100C, 100D can be viewed in a clockwise direction (or anticlockwise). The top surface 101 of the light-emitting device 100A faces the bottom surface 102 of the light-emitting device 100D. FIG. 11C illustrates a top view of a circuit board on which the light-emitting devices are mounted in accordance with an embodiment of the present disclosure. It is different from that of FIG. 11B that a light-emitting unit 15 is further disposed in a space between two adjacent light-emitting devices 100. The light-emitting unit 15 substantially emits light along the Z direction (see FIG. 10A). It is noted that the light-emitting device 100 emits white light and the light-emitting unit 15 emits red light so this configuration can improve the color rendering (CRI≥90) or the Color Quality Scale (CQS≥85).

Figure 11D:
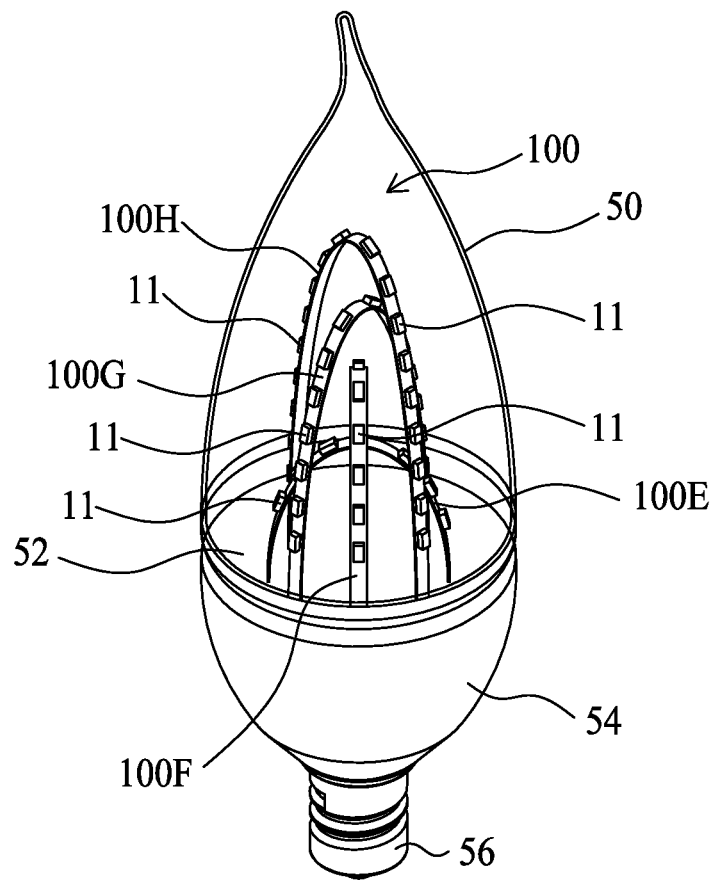
FIG. 11D illustrates a perspective view of an LED bulb in accordance with one embodiment of the present disclosure.
Figure 11E:
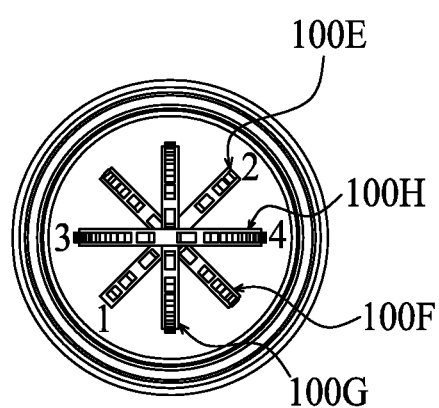
FIG. 11E illustrates a top view of FIG. 11D without a cover.

FIG. 11D illustrates a perspective view of an LED bulb in accordance with one embodiment of the present disclosure. The LED bulb includes a cover 50, four light-emitting devices 100, a circuit board 52, a heat sink 54, and an electrical connector 56. The detail structure of the light-emitting device 100 can be referred to the aforesaid embodiments. In this embodiment, the carrier of each of the light-emitting devices 100 is made of a flexible material, such as polyimide. The four light-emitting devices 100 are alternately arranged over each other on the circuit board 52. Specifically, the carrier of the bottom light-emitting device 100E is bent to have an arc shape and the top surface of the carrier faces outwardly so the light-emitting units 11 emit outwardly. Similarly, the carrier of each of the first middle light-emitting device 100F, the second middle light-emitting device 100G and the top light-emitting device 100H is bent to have an arc shape and the top surface of the carrier faces outwardly so the light-emitting units 11 emit outwardly. By this configuration, light can emit toward different directions such that an LED bulb with an omnidirectional direction light pattern can be obtained. FIG. 11E illustrates a top view of FIG. 11D without the cover 50. Each of the light-emitting devices 100E~100H extends in different directions (for example, the bottom light-emitting device 100E extends from point 1 to point 2; the top light-emitting device 100H from point 3 to point 4).

Figure 11F:
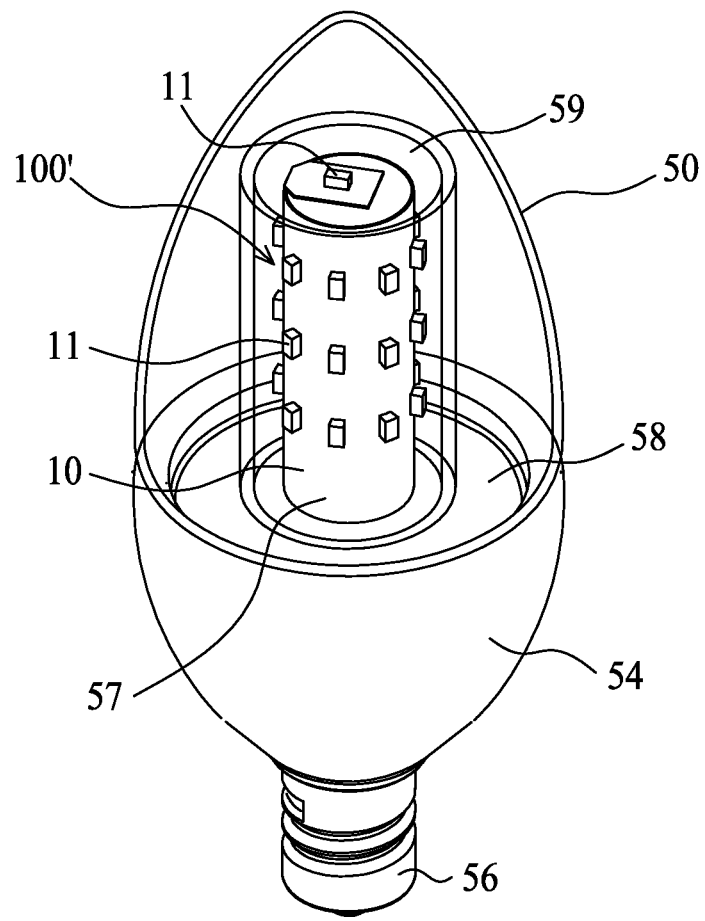
FIG. 11F illustrates a perspective view of an LED bulb in accordance with one embodiment of the present disclosure.
Figure 11G:
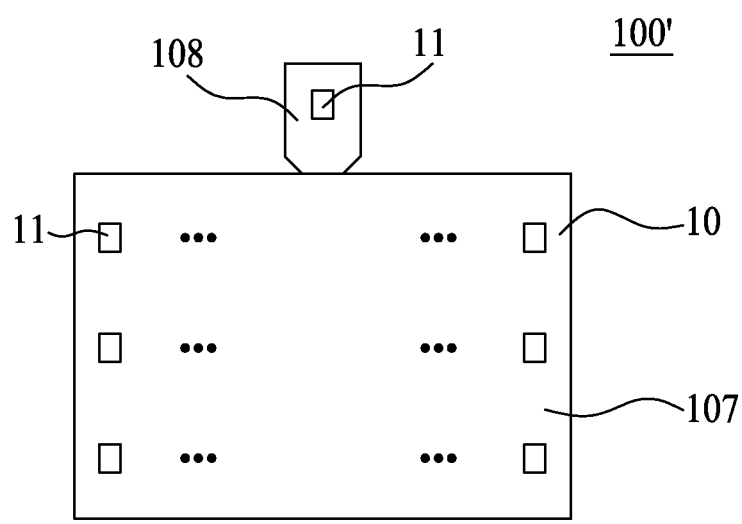
FIG. 11G illustrates a flexible carrier in a non-bending state.

FIG. 11F illustrates a perspective view of an LED bulb in accordance with one embodiment of the present disclosure. The LED bulb includes a cover 50, a post 57, a light-emitting device 100', a circuit board 58, a heat sink 54, and an electrical connector 56. The light-emitting device 100' includes a flexible carrier 10 and a plurality of light-emitting units 11 on the carrier 10. In this embodiment, the post 57 is a solid cylinder and has a circuit for electrically connecting to the light-emitting units 11. Alternatively, the post 57 can be a hollow cylinder. FIG. 11G illustrates the flexible carrier 10 in a non-bending state. The flexible carrier 10 has a first portion 107 and a second portion 108. In this embodiment, a plurality of light-emitting units 11 is arranged on the first portion 107 in an array and one light-emitting unit 11 is arranged on the second portion 108. When the flexible carrier 10 is attached to the post 57, the first portion 107 is bent to wind along the contour of a side surface of the post 57. Subsequently, the second portion 108 is bent in a direction toward a center of the post 57. After winding on the post 57, the second portion 108 is substantially perpendicular to the first portion 107. By this configuration, the light-emitting units 11 on the first portion 107 emit light toward a side direction and the light-emitting unit 11 on the second portion 108 emits light in an upward direction, thereby an LED bulb with an omnidirectional direction light pattern can be obtained. In addition, an enclosing structure 59 is optionally provided to fully enclose the light-emitting device 100' and the post 57. The enclosing structure 59 is transparent and can be made of a material like silicone or epoxy.

Figure 11H:
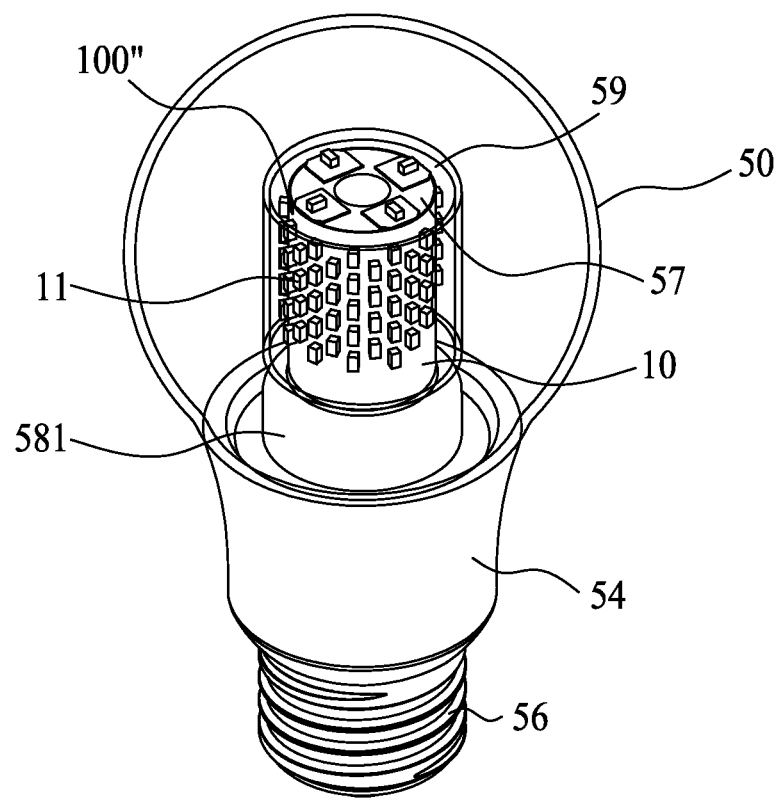
FIG. 11H illustrates a perspective view of an LED bulb in accordance with one embodiment of the present disclosure.
Figure 11I:
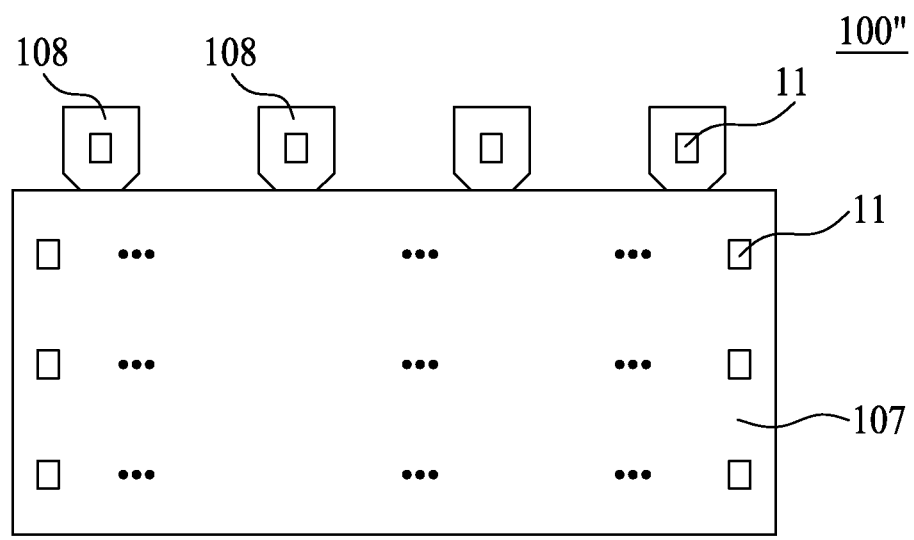
FIG. 11I illustrates a flexible carrier in a non-bending state.

FIG. 11H illustrates a perspective view of an LED bulb in accordance with one embodiment of the present disclosure. The LED bulb of FIG. 11H has a structure similar to that of FIG. 11F. The LED bulb is a type A bulb and includes a cover 50, a pedestal 581, a post 57, a light-emitting device 100", a heat sink 54, and an electrical connector 56. The light-emitting device 100" includes a flexible carrier 10 and a plurality of light-emitting units 11 on the carrier 10. In this embodiment, the post 57 is a hollow cylinder and has a circuit for electrically connecting to the light-emitting units 11. FIG. 11I illustrates the flexible carrier 10 in a non-bending state. Different from the light-emitting device 100', the light-emitting device 100" includes four second portions 108 each of which has one light-emitting unit 11 is arranged thereon. By this configuration, the light-emitting units 11 on the first portion 107 emit light toward a side direction and the light-emitting units 11 on the second portions 108 emit light in an upward direction, thereby an LED bulb with an omnidirectional direction light pattern can be obtained.

Figure 11J:
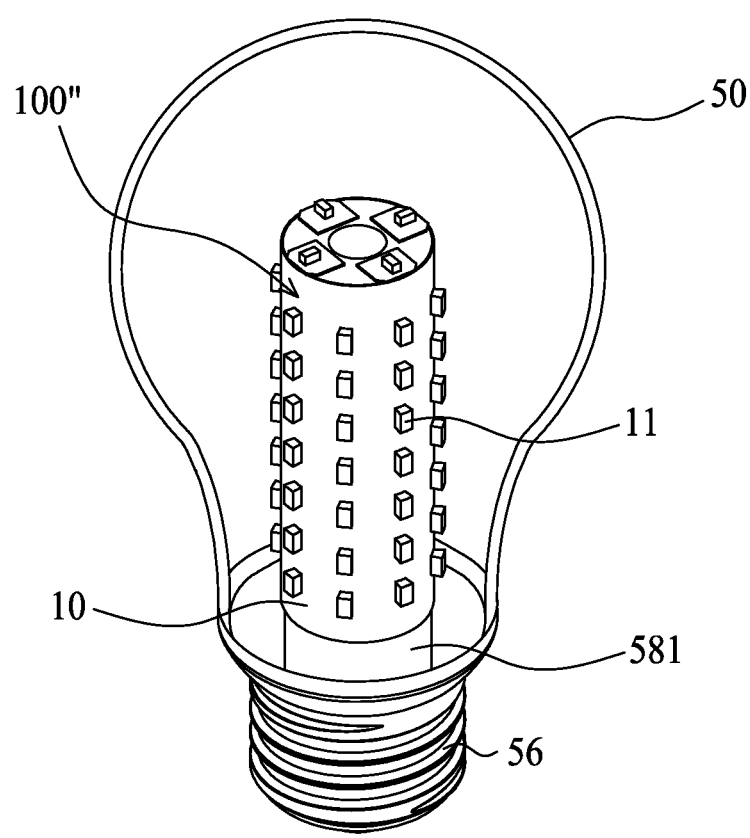
FIG. 11J illustrates a perspective view of an LED bulb in accordance with one embodiment of the present disclosure.

FIG. 11J illustrates a perspective view of an LED bulb in accordance with one embodiment of the present disclosure. The LED bulb of FIG. 11J has a structure similar to that of FIG. 11H. In this embodiment, the LED bulb does not include a heat sink and the cover 50 is directly connected to the electrical connector 56. The LED bulb is also the light-emitting bulb with an omnidirectional direction light pattern. It is noted that the aforesaid "omnidirectional direction light pattern" means the light pattern complying with the definition by Energy Star.

Figure 12:
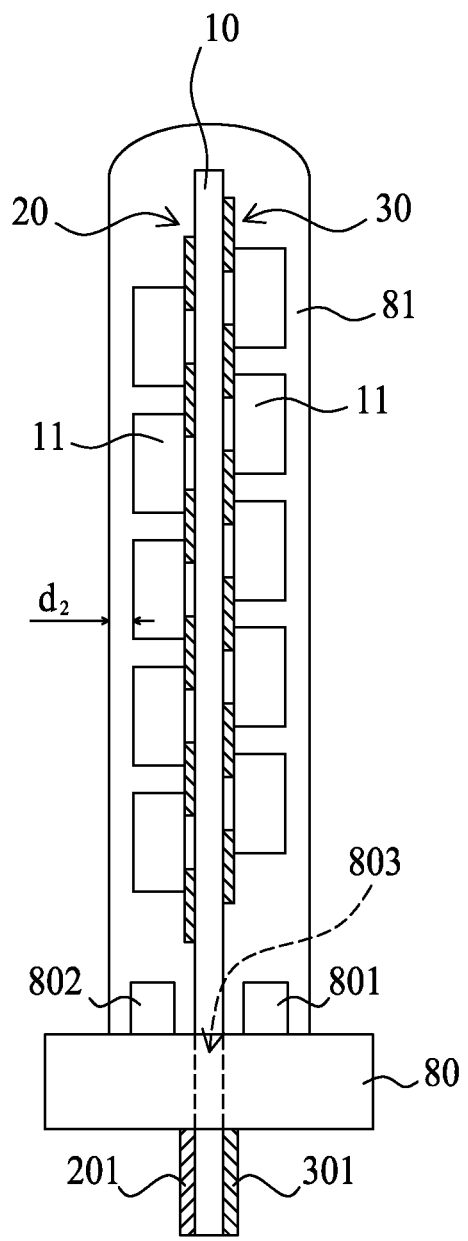
FIG. 12 illustrates a cross-sectional view of an LED tube in accordance with one embodiment of the present disclosure.

FIG. 12 illustrates a cross-sectional view of a light-emitting tube in accordance with one embodiment of the present disclosure. The light-emitting tube includes a light-emitting device, a holder 80 and a cover 81. The aforesaid light-emitting devices can be combined with each other to apply in this light-emitting tube. In another embodiment, the cover 81 can be made of a flexible material such as polyimide (PI). In this embodiment, taking the light-emitting device of FIGS. 4A and 4B for example, the holder 80 includes a first clamp portion 801, a second clamp portion 802, and a penetrating hole 803. The first clamp portion 801 and the second clamp portion 802 are spaced apart from each other and define a space therebetween. The light-emitting device has a part passing through the space and further through the penetrating hole 803 to expose the top electrode pad 201 and the bottom electrode pad 301 for electrically connecting to the external source. With the clamp portions 801, 802 tightly clamping the light-emitting device, the light-emitting device can be mounted on the holder 80. In another embodiment, the space between the clamp portions 801, 802 is larger than a width of the light-emitting device and does not directly contact the light-emitting device so an adhesive substance (not shown) is filled within the space between the clamp portions 801, 802 for firmly mounting the light-emitting device on the holder. The holder 82 substantially divides the light-emitting device into two sides wherein one is with the light-emitting units 11 and the other is with the top electrode pad 201 and the bottom electrode pad 301. The cover 81 merely covers the side with light-emitting units 11 but does not cover the side with top electrode pad 201 and the bottom electrode pad 301. In addition, the cover 81 is spaced apart from the light-emitting device by a shortest distance (d2) smaller than 2 mm for efficiently dissipating heat from the light-emitting device to ambient (air) through the cover. Alternatively, a filler can be filled between the cover 81 and the light-emitting device and includes a transparent substance, a wavelength conversion layer or a diffusing layer (not shown). The filler directly contact the light-emitting device for conducting heat from the light-emitting device to ambient (air) therethrough. Moreover, because of the filler, the light-emitting device has a better hot/cold ratio. To be more specific, when the light-emitting device is connected to the external source, in an initial state, a cold-state lighting efficiency (light output (lumen)/watt) is measured, hereinafter, in every period of time (ex. 30 ms), the lighting efficiency is measured. When a difference between the adjacent measured light emitting efficiencies is smaller than 0.5%, the latter light efficiency is defined as a hot-state lighting efficiency. The hot/cold ratio is a ratio of the hot-state lighting efficiency to the cold-state lighting efficiency. In this embodiment, when the filler is filled between the light-emitting device and the cover, the hot/cold ratio of the light-emitting device is $R_1$, and when the filler is not filled between the light-emitting device and the cover, the hot/cold ratio of the light-emitting device is $R_2$, wherein a difference of $R_1$ and $R_2$ is larger than 20%. The adhesive substance can be made of a material the same as the transparent substance. The cover 81 includes diamond, glass, epoxy, quartz, acrylic resin, $SiO_x$, $Al_2O_3$, ZnO or silicone. The transparent substance includes silicone, epoxy, polyimide (PI), BCB, perfluorocyclobutane (PFCB), SUB, acrylic resin, polymethyl methacrylate (PMMA), polyethylene terephthalate (PET), polycarbonate (PC), polyetherimide, fluorocarbon polymer, $Al_2O_3$, SINR, spin-on-glass (SOG).

Figure 12A:
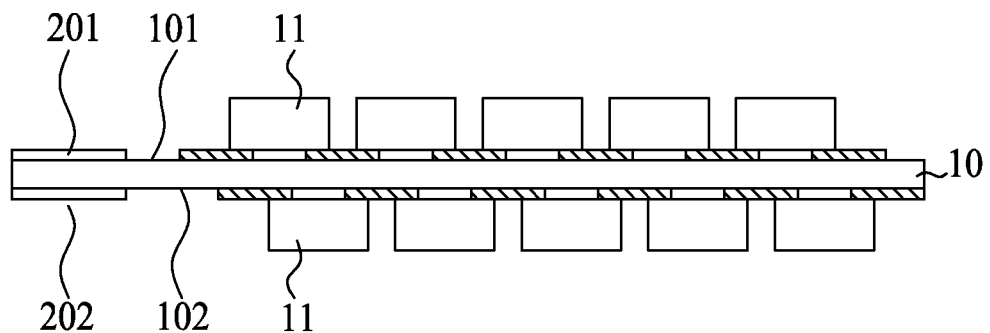
FIGS. 12A 12C illustrating a method of making the LED tube of FIG. 12.
Figures 12B, 12C:
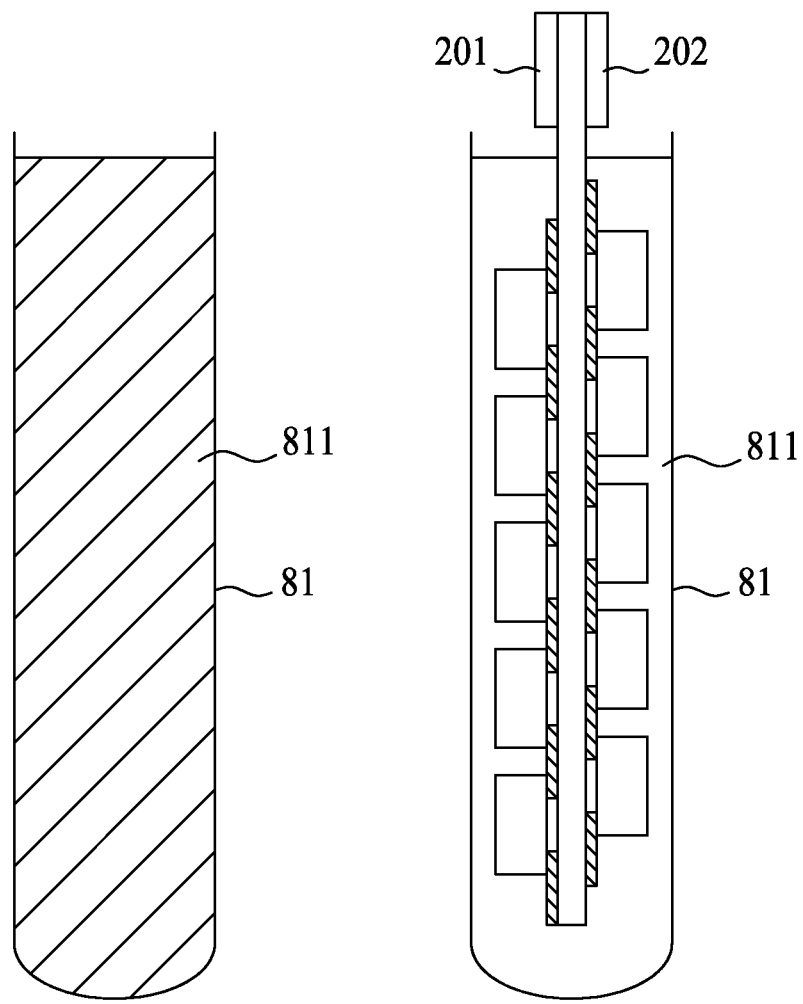

FIGS. 12A-12C illustrate drawings of a method making the light-emitting tube of FIG. 12. Referring to FIG. 12A, a carrier 10 is provided and a plurality of light-emitting units 11 disposed on the top surface 101 and the bottom surface 102 of the carrier 10 to form a light-emitting device. Referring to FIG. 12B, a hollow cover 81 is provided and has an open end and a closed end. A transparent substance 811 (which can include a wavelength conversion material and/or a diffusing powder) is filled into the cover 81 from the open end. Referring to FIG. 12C, a portion of the light-emitting device is embedded into the transparent substance 811 such that the top electrode pad 201 and the bottom electrode pad 301 are exposed from the open end. It is noted that, in the embedded step, gas (air, bubble) may be generated, and a degas step can be performed to remove the gas. Alternatively, the gas is not entirely removed so there is gas existing in the transparent substance 811. Subsequently, the transparent substance 811 can be solidified by heating or lighting. Optionally, before the solidification, a holder is provided and the light-emitting device passes through the penetrating hole of the holder and is mounted on the holder (as shown in FIG. 12) such that the side with the light-emitting units is fully sealed by the cover to expose the top electrode pad 201 and the bottom electrode pad 301 for electrically connecting to the external source.

Figure 13A:
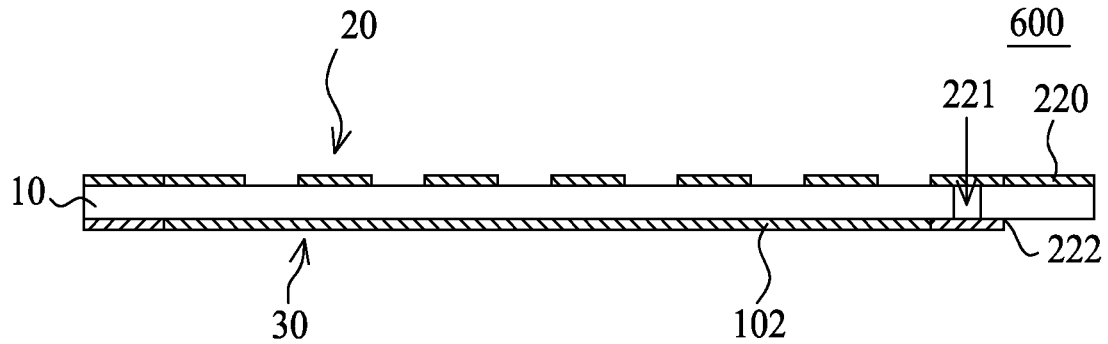
FIGS. 13A 13D are views illustrating a method of making a light-emitting device in accordance with another embodiment of the present disclosure.
Figure 13B:
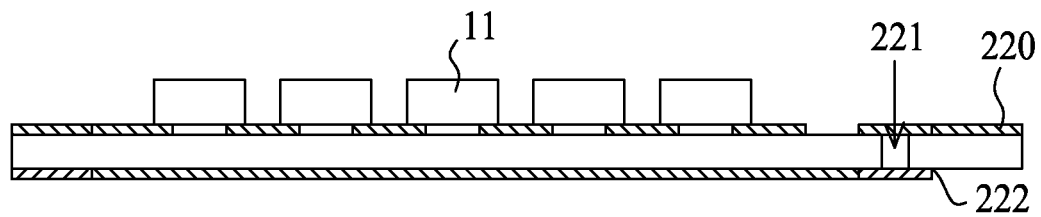
FIG. 13E illustrate a cross-sectional view of a light-emitting device of FIG. 13D.
Figure 13C:
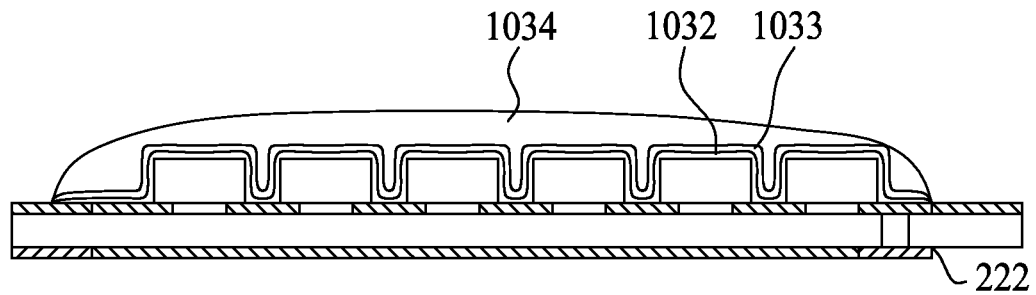
Figure 13D:
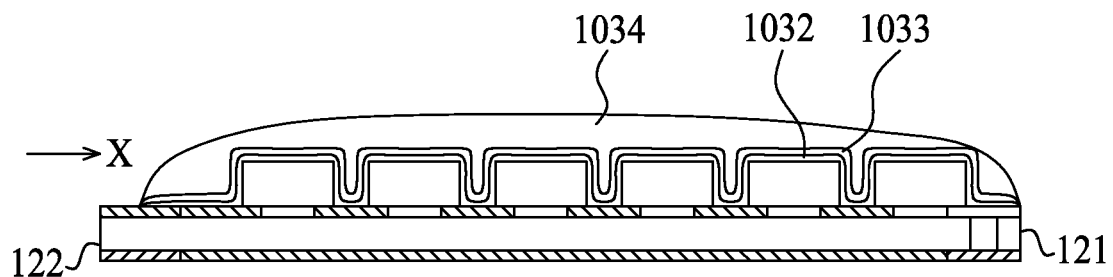
Figure 13E:
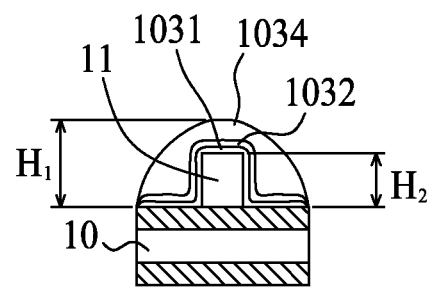

FIGS. 13A-13D illustrate drawings of a method making the light-emitting device 600 in accordance with one embodiment of the present disclosure. The light-emitting device 600 is similar with the light-emitting device 100. The devices, elements or steps with similar or the same symbols represent those with the same or similar functions. Referring to FIG. 13A and FIG. 13B, a carrier 10 is provided and the top electrode 20, the bottom electrode 30 and a temporary electrode 220 are formed on the carrier 10 using printing. A hole 221 is formed and a conductive material is fully or partly filled with the hole 221 for electrically connecting the top electrode 20 with the bottom electrode 30. The temporary electrode 220 can be electrically connected to the top electrode 20. Furthermore, a scribe line 222 is formed on the bottom surface 102 of the carrier at a position corresponding to the temporary electrode 220. The light-emitting units 11 are mounted on the top electrode 20 (or/and the bottom electrode, as shown in FIG. 5A) of the carrier 10 by surface mounted technology or wiring bonding. Referring to FIGS. 13C and 13D, a first transparent layer 1032 is formed to cover the light-emitting units 11 along its contour; a wavelength conversion layer 1033 is formed to cover the first transparent layer 1032 along its contour; and a second transparent layer 1034 is formed to cover the wavelength conversion layer 1033 without having the same contour as the wavelength conversion layer 1033. During test, the positive node and the negative node of the external source are connected to the top electrode 20 and the temporary electrode 220, respectively, so the light-emitting units 11 emit light. Hereinafter, the temporary electrode 220 and portions of the carrier 10 are removed along the scribe line 222. In this embodiment, the temporary electrode 220 is removed using breaking, laser dicing, or diamond dicing that such methods can cause a side 121 of the carrier 10 with a rough, unsmooth, or irregular surface. On the contrary, another side 122 of the carrier has a smooth surface. Therefore, the side 121 and another side 122 have different roughness. The wavelength conversion layer can be a single layer or a multilayer structure. FIG. 13E is a cross-sectional view of FIG. 13D (along X direction). The light-emitting unit 11 has a height ($H_2$), a maximum distance between the second transparent layer 1034 and the carrier is $H_1$; $H_2 \geq 0.5 H_1$. It is noted that when the light-emitting unit 11 includes the first transparent structure (the light-emitting diode units 2000, 2001 or 2002 in FIG. 8A, FIG. 8B to FIG. 8D), and the first transparent structure 7026 is made of a material the same as the first transparent layer 1032, an interface formed therebetween is vague under the electrical microscopy or the interface does not exist between the first transparent structure 7026 and the first transparent layer 1032.

While the aforesaid light-emitting device is applied in an alternating current (AC) power supply or a direct current (DC) power supply with a root mean square voltage of 120V, the light-emitting device can be designed to have an operating voltage of 140V±10%; while the light-emitting device is applied in an alternating current (AC) power supply or a direct current (DC) power supply with a root mean square voltage of 100V, the light-emitting device can be designed to have an operating voltage of 115V±10%; while the light-emitting device is supplied with an alternating current (AC) power supply or a direct current (DC) power supply with a root mean square voltage of 220V, the light-emitting device can be designed to have an operating voltage of 280V±10%. The alternating current (AC) power supply is rectified to a direct current (DC) power supply. Furthermore, the light-emitting device can also be supplied with a direct current power supply with a substantially constant voltage (ex. battery) and the light-emitting device can be designed to have an operating voltage smaller than 15V. In addition, a plurality of light-emitting devices is disposed in a support and the light-emitting devices are electrically connected to each other in series, in parallel, in series-parallel for increasing the applications. Moreover, the aforesaid light-emitting device or light tube can also be applied in U-shape lamp, spiral lamp, bulb, and candle lamp.

It is noted that, besides the light-emitting diode unit (FIGS. 7A-7D, 8A-8B and 8D) described in the present disclosure can be used as any one of the light-emitting units. However, the conventional package structure (for example, 3014 or 5630 package) can be used as any one of the light-emitting units.

It is noted that the foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

The invention claimed is:

1. A light-emitting device, comprising:
a carrier having a top surface;
a first electrode strip disposed on the top surface, and having a first stripe and a plurality of first branches, the first stripe having a first extending direction different from a second extending direction of each of the plurality of first branches;
a second electrode strip separated from the first electrode strip, disposed on the top surface, and having a second stripe and a plurality of second branches, the second stripe having a third extending direction different from a fourth extending direction of each of the plurality of second branches; and
a plurality of first light-emitting units disposed on the top surface, each of the plurality of first light-emitting units being connected to one of the plurality of first branches and one of the plurality of second branches.

2. The light-emitting device of claim 1, wherein the first electrode strip and the second electrode strip are substantially parallel to each other.

3. The light-emitting device of claim 1, wherein the plurality of first branches and the plurality of second branches are in an interlaced arrangement.

4. The light-emitting device of claim 1, further comprising a third electrode strip electrically connected to the second electrode strip and comprising a third stripe and a plurality of third branches, wherein the third stripe has a fifth extending direction different from a sixth extending direction of each of the plurality of third branches.

5. The light-emitting device of claim 4, further comprising a fourth electrode strip separated from the third electrode strip and comprising a fourth stripe and a plurality of fourth branches, wherein the fourth stripe has a seventh extending direction different from an eighth extending direction of each of the plurality of fourth branches.

6. The light-emitting device of claim 5, further comprising a plurality of second light-emitting units, each of the plurality of second light-emitting units being connected to one of the plurality of third branches and one of the plurality of fourth branches.

7. The light-emitting device of claim 4, further comprising a conductive material connecting the third electrode strip and the second electrode strip.

8. The light-emitting device of claim 1, wherein at least one of the plurality of first light-emitting units is a flip-chip.

9. The light-emitting device of claim 1, further comprising a transparent body covering the plurality of first light-emitting units.

10. The light-emitting device of claim 9, wherein the transparent body comprises a wavelength conversion layer.

* * * * *